United States Patent
Ide

(10) Patent No.: US 12,320,869 B2
(45) Date of Patent: Jun. 3, 2025

(54) MAGNETIC SENSOR AND CURRENT SENSOR INCLUDING MAGNETO-RESISTANCE ELEMENT

(71) Applicant: Alps Alpine Co., Ltd., Tokyo (JP)

(72) Inventor: Yosuke Ide, Niigata-ken (JP)

(73) Assignee: ALPS ALPINE CO., LTD., Tokyo (JP)

( * ) Notice: Subject to any disclaimer, the term of this patent is extended or adjusted under 35 U.S.C. 154(b) by 91 days.

(21) Appl. No.: 17/866,815

(22) Filed: Jul. 18, 2022

(65) Prior Publication Data
US 2022/0349962 A1 Nov. 3, 2022

Related U.S. Application Data

(63) Continuation of application No. PCT/JP2021/001866, filed on Jan. 20, 2021.

(30) Foreign Application Priority Data

Jan. 23, 2020 (JP) .................................. 2020-009030

(51) Int. Cl.
*G01R 33/09* (2006.01)
*G01R 15/20* (2006.01)

(52) U.S. Cl.
CPC .......... *G01R 33/091* (2013.01); *G01R 15/205* (2013.01)

(58) Field of Classification Search
CPC ..... G01R 33/091; G01R 15/205; G01R 15/20
See application file for complete search history.

(56) References Cited

U.S. PATENT DOCUMENTS

| 9,423,469 | B2 * | 8/2016 | Gudel | ............... | G01R 33/0017 |
| 2013/0057273 | A1 | 3/2013 | Ide | | |
| 2018/0152056 | A1 * | 5/2018 | Takahashi | ............... | H02P 27/06 |
| 2022/0279687 | A1 * | 9/2022 | Lee | .......... | H01F 27/36 |

FOREIGN PATENT DOCUMENTS

| JP | 2013-53903 A | 3/2013 |
| JP | 2019-2742 A | 1/2019 |
| JP | 2019-138807 A | 8/2019 |
| JP | 2019-138865 A | 8/2019 |
| WO | WO 2017/094336 A1 | 6/2017 |
| WO | WO 2017-199519 A1 | 11/2017 |

OTHER PUBLICATIONS

International Search Report and Written Opinion from corresponding International Application No. PCT/JP2021/001866, Apr. 6, 2021, 7pp.
Notice of Reasons for Refusal, Japanese Patent Application No. 2021-572767, May 26, 2023, Yohei Aoki, Katsuyuki Okubo, Article 29, translation (6 pages).

* cited by examiner

*Primary Examiner* — Reena Aurora
(74) *Attorney, Agent, or Firm* — Crowell & Moring LLP

(57) ABSTRACT

A magnetic sensor includes a magnetic-field detector including magneto-resistance elements, and a shield. Since the feedback coil is disposed so as to overlap with the magnetic-field detector, and the shield is disposed so as to overlap with the feedback coil, the cancellation field of the feedback coil makes it difficult to cause magnetization saturation. The shield is annular in shape as viewed from a direction normal to the shield. This allows maintaining the magnetic-field shielding action of the shield to enhance the effect of shielding the magnetic field in a direction perpendicular to the sensitivity.

6 Claims, 20 Drawing Sheets

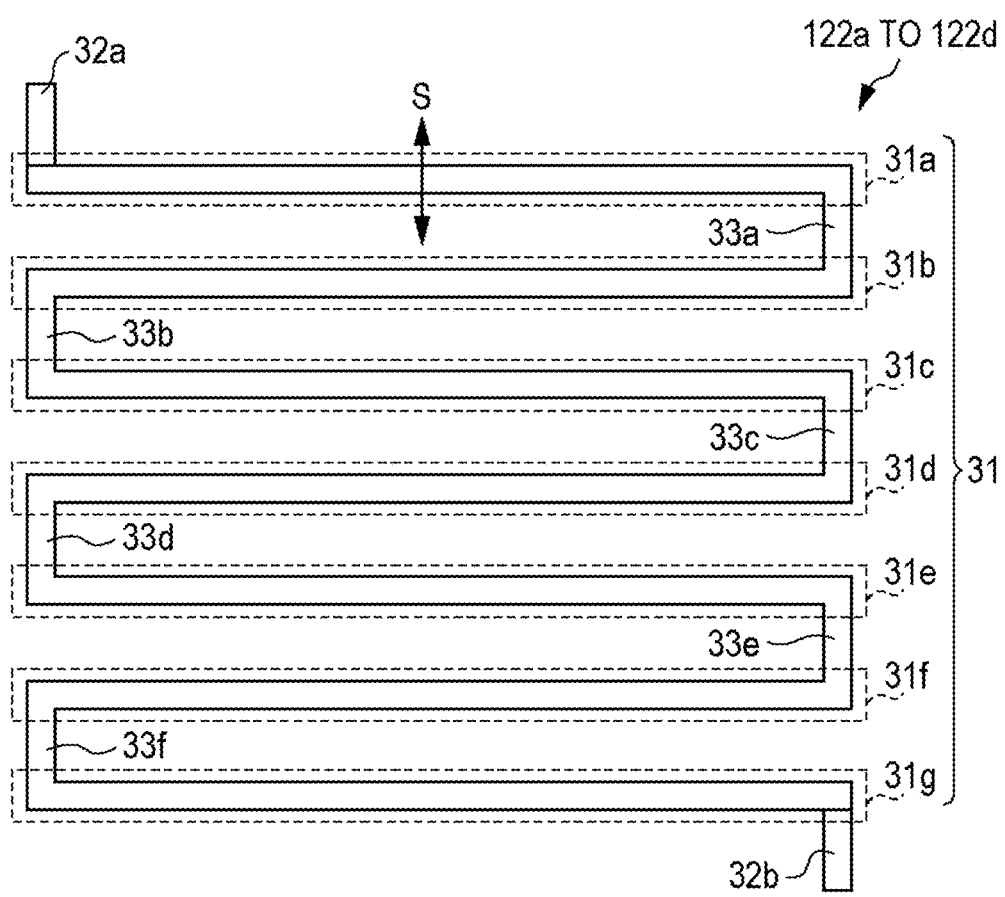
FIG. 4
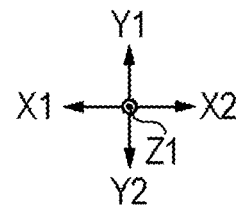

FIG. 9
PRIOR ART
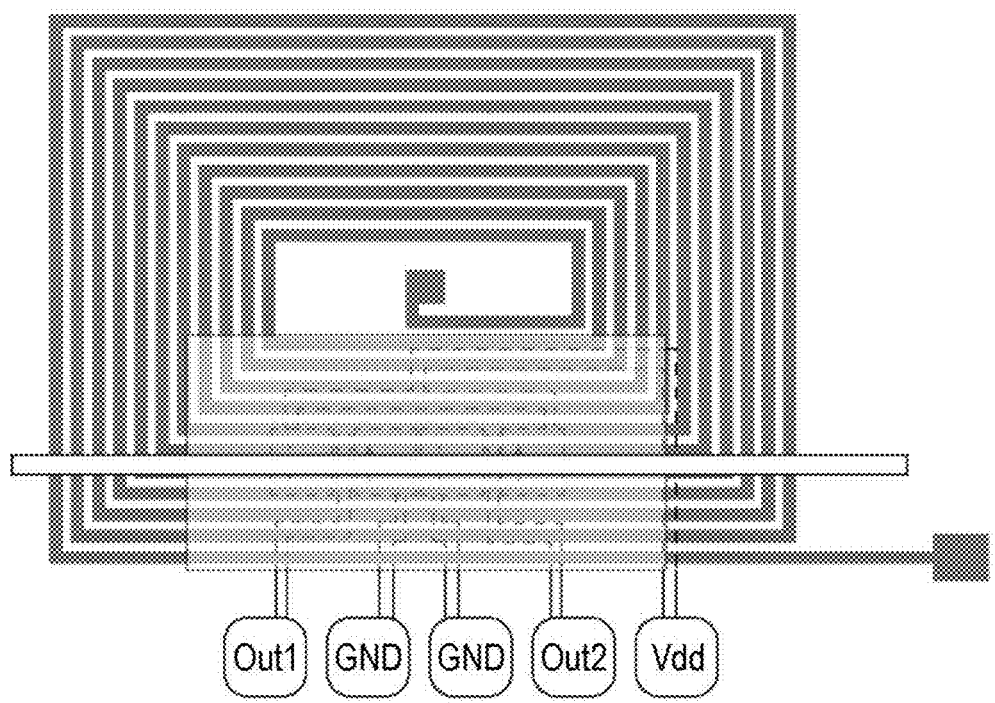
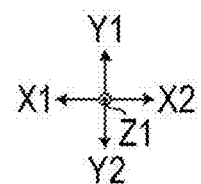

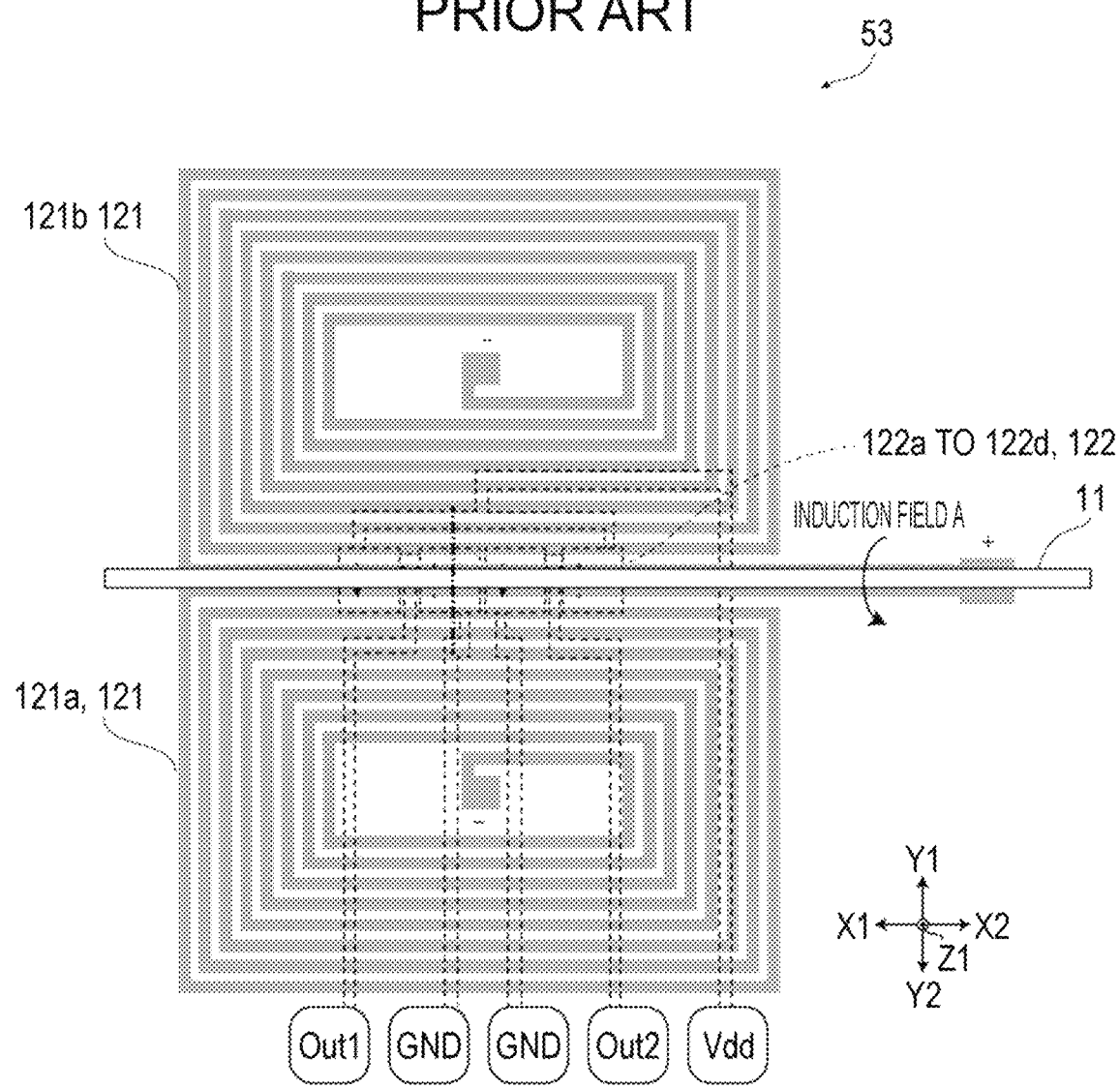

122a TO 122d

MAGNETIC SENSOR AND CURRENT SENSOR INCLUDING MAGNETO-RESISTANCE ELEMENT

CLAIM OF PRIORITY

This application is a Continuation of International Application No. PCT/JP2021/001866 filed on Jan. 20, 2021, which claims benefit of priority to Japanese Patent Application No. 2020-009030 filed on Jan. 23, 2020. The entire contents of each application noted above are hereby incorporated by reference.

BACKGROUND

1. Field of the Disclosure

The present disclosure relates to magnetic sensors and current sensors including magneto-resistance elements, a feedback coil, and a shield.

2. Description of the Related Art

Motor drive technology for electric vehicles, for example, uses relatively large currents and therefore requires sensors capable of non-contact measurement of large currents. As such sensors, current sensors are practical for this use. Current sensors detect changes in the magnetic field generated by the current to be measured with a magnetic sensor. Some current sensors of this type have a component serving as a shield against an external magnetic field that the magnetic sensor receives to reduce the external magnetic field. The use of such a shield can improve resistance to a transverse magnetic field in the direction orthogonal to the sensitivity and can decrease a magnetic field intensity that the magnetic sensor receives to raise the upper limit of practically measurable field intensity, thereby increasing the measurable range (dynamic range) of the current sensor.

Japanese Unexamined Patent Application Publication No. 2013-53903 describes a configuration for a current sensor including a magneto-resistance element, a magnetic shield, and a feedback coil in which the magnetic shield includes a first flat magnetic shield and second flat magnetic shields spaced apart from the first magnetic shield in the in-plane direction of the main surface of the first magnetic shield to reduce the external magnetic field and prevent the influence of hysteresis.

The current sensor disclosed in Japanese Unexamined Patent Application Publication No. 2013-53903 has the second magnetic shields on both sides of the first magnetic shield in the sensitivity direction to prevent the influence of a reflux magnetic field due to the remanent magnetization of the first magnetic shield on the magneto-resistance element. However, the second magnetic shields are disposed at portions where the second magnetic shields do not overlap with the feedback coil. Therefore, the magnetization saturation of the second magnetic shields cannot be prevented using the magnetism from the feedback coil. Since the magnetization saturation of the second magnetic shields hinders reducing the disturbance magnetic field, this current sensor is not enough to give a shielding effect against magnetic fields in the direction orthogonal to the sensitivity and to increasing the anisotropy field of the first magnetic shield apparently.

Therefore, it is desirable to provide a magnetic sensor and a current sensor having a high shielding effect against magnetic fields in the direction orthogonal to the sensitivity and having excellent transverse magnetic field resistance.

It is also desirable to provide a magnetic sensor and a current sensor in which the anisotropy field of the shield, which decreases the intensity of the magnetic field to be measured to be applied to the magnetic-field detector, is large and the measurable range is large.

SUMMARY

According to a first aspect of the present invention, a magnetic sensor includes a magnetic-field detector including a magneto-resistance element, a feedback coil, and a shield. The feedback coil is disposed so as to overlap with the magnetic-field detector. The shield is disposed so as to overlap with the feedback coil, and the shield is annular in shape as viewed from a direction normal to the shield.

Since the shield is disposed to overlap with the feedback coil, the cancellation field makes it difficult to cause magnetization saturation of the shield. This allows maintaining the magnetic-field shielding action of the shield to enhance the resistance to the transverse magnetic field of the magnetic sensor.

According to a second aspect of the present invention, a magnetic sensor includes a magnetic-field detector including at least one magneto-resistance element, a feedback coil, and a shield. The feedback coil is disposed so as to overlap with the magnetic-field detector. The shield is disposed so as to overlap with the feedback coil. The shield includes an inner shield disposed so as to decrease intensity of a magnetic field to be measured to be applied to the magnetic-field detector, and an outer shield disposed so as to decrease intensity of the magnetic field to be measured to be applied to the inner shield.

Since the magnetic field to be measured coming from the sensitivity direction is blocked by the outer shield, the magnetic field to be applied to the inner shield is decreased. The decrease in the magnetic field to be applied increases the saturation magnetic field, allowing for increasing the apparent anisotropy field (hereinafter referred to as "Hk" as appropriate) of the inner shield. In other words, disposing the outer shield to decrease the effective magnetic field applied to the inner shield allows for increasing the apparent Hk of the inner shield without essentially changing the Hk of the inner shield. The apparent increase in the Hk of the inner shield increase the range of the inner shield in which the permeability ($\mu$) is constant, enabling the magnetic sensor to have a wide measurable range.

Furthermore, since the outer shield is disposed to overlap with the feedback coil, the outer shield is made less susceptible to magnetization saturation by using a cancellation field. This allows maintaining the magnetic-field shielding action of the outer shield to reduce the magnetic field that reaches the inner shield, thereby increasing the apparent Hk of the inner shield.

BRIEF DESCRIPTION OF THE DRAWINGS

FIG. 4 is a partial enlarged view of a magneto-resistance element according to the first embodiment;

FIG. 9 is a plan view of a magnetic sensor according to Comparative Example 1 illustrating the configuration thereof;

FIG. 16 is a plan view of a magnetic sensor according to Comparative Example 2 illustrating the configuration thereof;

DESCRIPTION OF THE EXEMPLARY EMBODIMENTS

Figure 1:
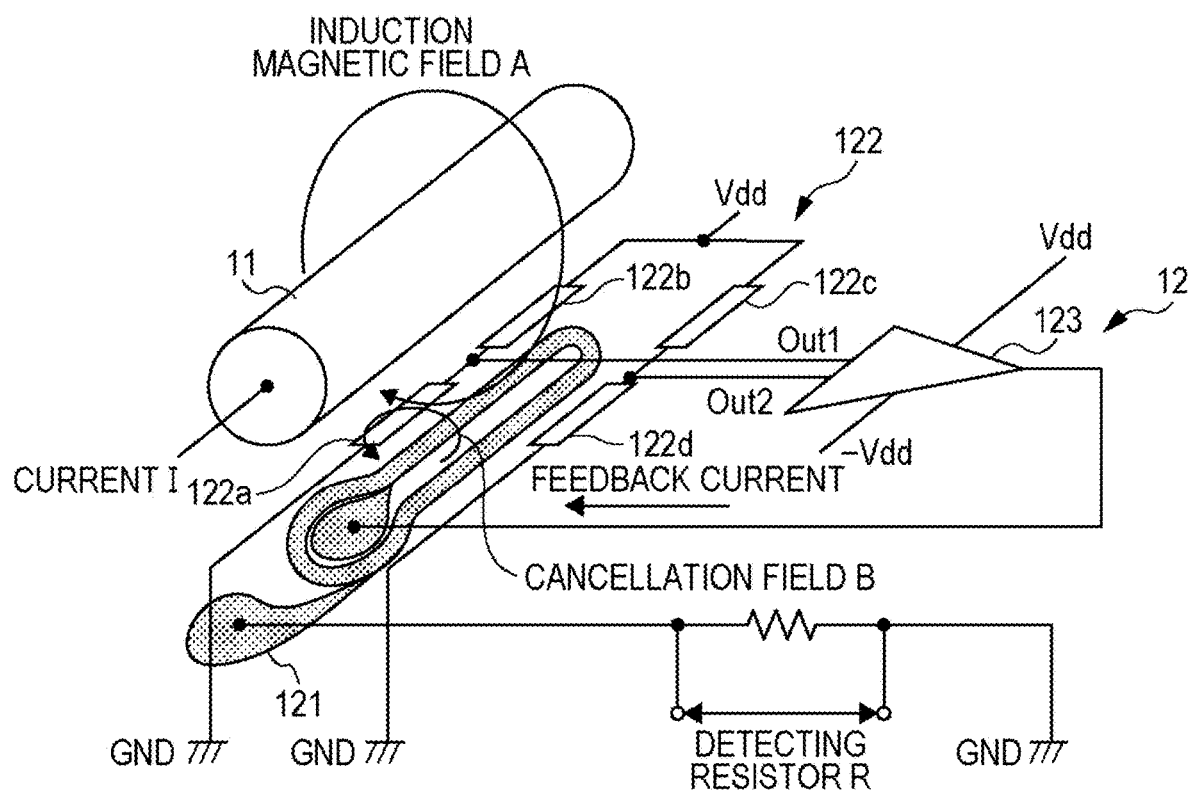
FIG. 1 is a schematic diagram illustrating the configuration of a current sensor including a magnetic sensor according to a first embodiment.

Embodiments of the present invention will be described with reference to the drawings. In the drawings, the same components are denoted by the same reference signs, and descriptions thereof will be omitted as appropriate.

First Embodiment

FIG. 1 is a schematic diagram illustrating the configuration of a magnetic balance current sensor including a magnetic sensor 12 according to this embodiment. FIG. 1 illustrates the connection relationship among magneto-resistance elements 122a to 122d constituting a magnetic-field detector or detecting unit 122 of the magnetic sensor 12. The specific configuration, arrangement, and the positional relationship between a feedback coil and a shield will be described with reference to FIG. 2 and following.

As shown in FIG. 1, the magnetic sensor 12 is disposed adjacent to a conductor (a current line) 11 through which a current I to be measured passes. The magnetic sensor 12 includes a feedback circuit that generates a cancellation field B that cancels an induction field A, which is an induction field induced by the current I.

A feedback coil 121 has a spiral flat wiring pattern, through which a current passes so that the inverted cancellation field B corresponding to the induction field A can be generated.

The magneto-resistance elements 122a to 122d of the magnetic-field detector or detecting unit 122 change in resistance value when an external magnetic field is applied. Examples of the elements include a giant magneto-resistance (GMR) element and a tunnel magneto-resistance (TMR) element. In the magnetic sensor 12 of this embodiment, the magneto-resistance elements 122a to 122d are connected in predetermined relationship, which constitute a magnetic-field detecting bridge circuit that detects variations in external magnetic field. The use of the magnetic-field detecting bridge circuit including the magneto-resistance elements 122a to 122d enables the magnetic sensor 12 to detect the induction field A to be measured induced by the current I with high sensitivity. The magnetic-field detecting bridge circuit is not limited to the circuit shown in FIG. 1. The magnetic-field detecting bridge circuit may include a fixed resistance element whose resistance value is not changed by an external magnetic field. The magnetic sensor 12 can measure a current by measuring the induction field A and is also referred to as a current sensor that measures the current I.

In the magnetic-field detecting bridge circuit of the magnetic-field detector or detecting unit 122, a power source that applies a power-supply voltage Vdd is connected to the node between the magneto-resistance element 122b and the magneto-resistance element 122c. A ground that applies a ground voltage GND is connected to one end of the magneto-resistance element 122a and one end of the magneto-resistance element 122d. A first output voltage Out1 is output from the node between the magneto-resistance element 122a and the magneto-resistance element 122b, and a second output voltage Out2 is output from the node between the magneto-resistance element 122c and the magneto-resistance element 122d. The voltage difference between the two output voltages corresponds to an external magnetic field applied to the magneto-resistance elements 122a to 122d.

The voltage difference between the first output voltage Out1 and the second output voltage Out2 is amplified by an amplifier 123 and is applied as a current (a feedback current) to the feedback coil 121. In other words, the feedback current has a magnitude corresponding to the voltage difference between the first output voltage Out1 and the second output voltage Out2. When the feedback current passes through the feedback coil 121, the cancellation field B that cancels the induction field A detected by the magnetic-field detector or detecting unit 122 is generated around the feedback coil 121. When the field intensity of the induction field A is high, the voltage difference of the magnetic-field detecting bridge circuit is large to increase the feedback current that passes through the feedback coil 121, which also increases the cancellation field B. When the field intensity of the induction field A is low, the voltage difference of the magnetic-field detecting bridge circuit is small to decrease the feedback current that passes through the feedback coil 121, which also decreases the cancellation field B. Thus, the feedback coil 121 generates the cancellation field B that cancels the induction field A. The induction field A and the current I are calculated by a detecting resistor R, which is a detection unit, on the basis of the value of the feedback current in a balanced state in which the induction field A and the cancellation field B cancel each other.

Figure 2A:
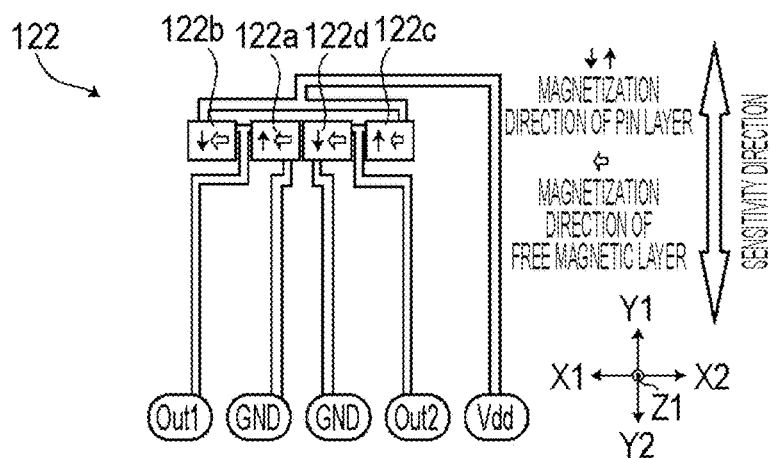
FIG. 2A is a plan view of a magnetic-field detector of the magnetic sensor according to the first embodiment.
Figure 2B:
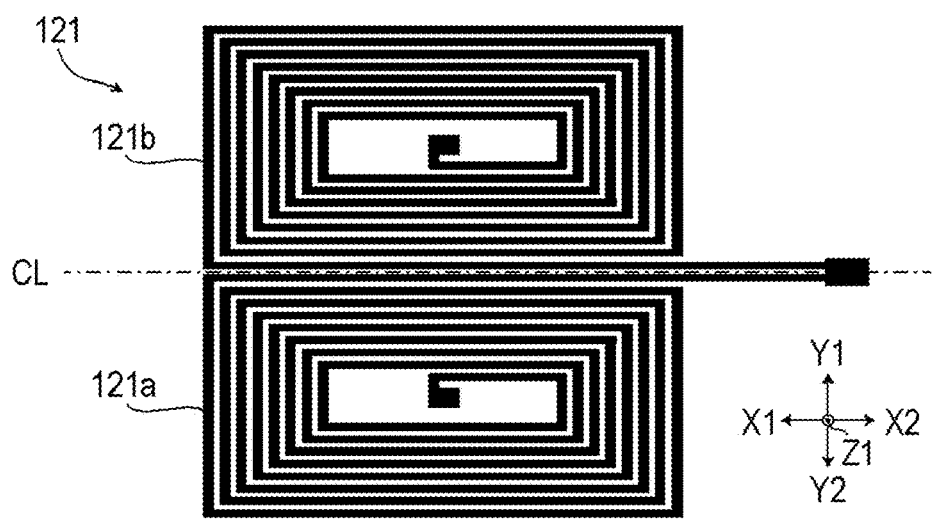
FIG. 2B is a plan view of a feedback coil of the magnetic sensor according to the first embodiment.
Figure 2C:
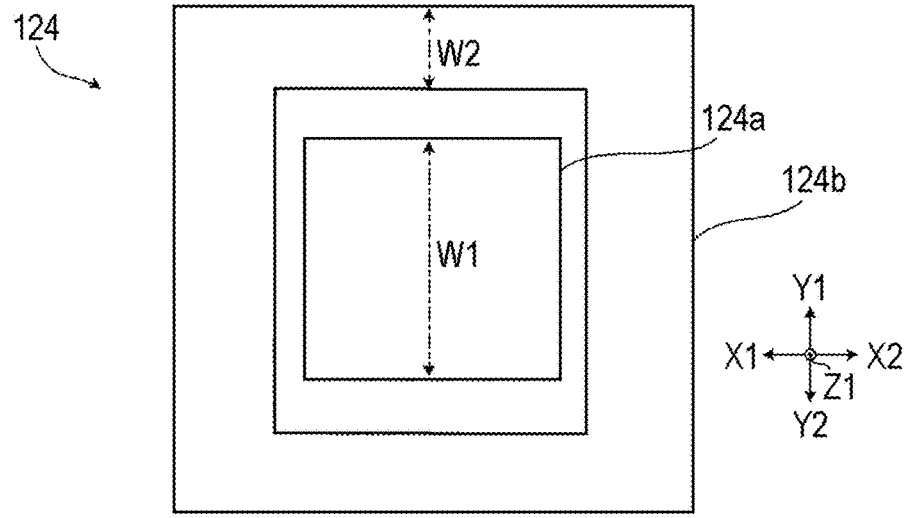
FIG. 2C is a plan view of a shield of the magnetic sensor according to the first embodiment.

FIGS. 2A, 2B, and 2C are plan views of the magnetic-field detecting unit 122, the feedback coil 121, and a shield 124 of the magnetic sensor 12 according to this embodiment, respectively.

Figure 3:
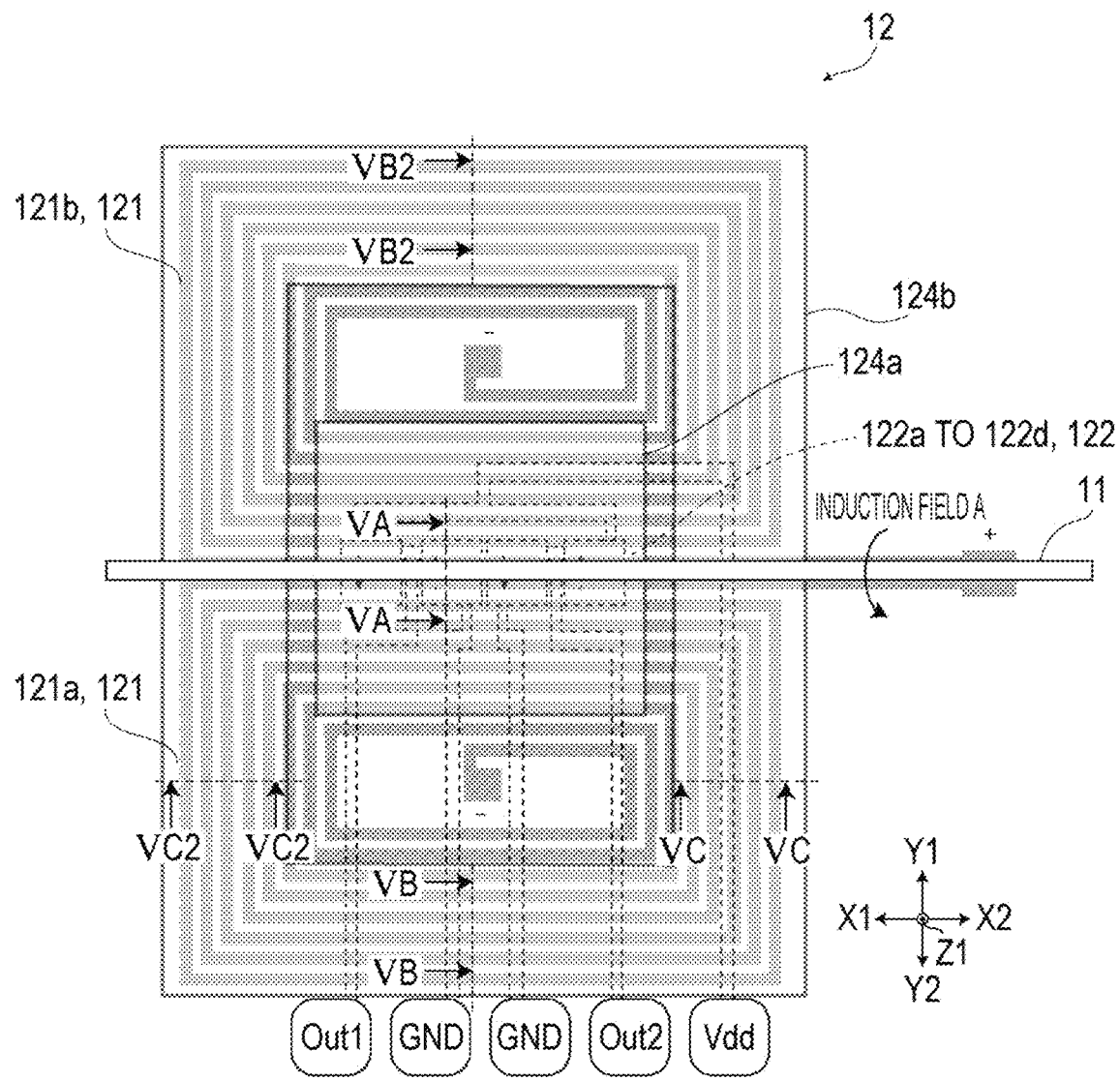
FIG. 3 is a plan view of the magnetic sensor according to the first embodiment illustrating the configuration thereof.

FIG. 3 is a plan view of the magnetic sensor 12 according to an embodiment illustrating the configuration thereof, which schematically illustrates the positional relationship among the components shown in FIGS. 2A to 2C in a layered state.

As shown in the drawings, the magnetic sensor 12 of this embodiment includes the magnetic-field detector 122 including the magneto-resistance elements 122a to 122d, the feedback coil 121, and the shield 124.

As shown in FIG. 2A, the magnetic-field detector 122 includes a magnetic-field detecting bridge circuit including the magneto-resistance elements 122a to 122d. In the drawing, the direction of magnetization of the pin layer is indicated by the arrows, and the direction of magnetization of the free magnetic layer is indicated by the empty arrow in the case where GMR elements are used as the magneto-resistance elements 122a to 122d. The sensitivity direction in which the magnetic-field detector 122 detects magnetism shown in the drawing is the Y1-Y2 direction. The four magneto-resistance elements 122a to 122d are arranged in the X1-X2 direction.

FIG. 4 is a partial enlarged view of the magneto-resistance elements 122a to 122d according to this embodiment. As shown in the drawings, the magneto-resistance elements 122a to 122d include a magnetic-field detecting pattern in which a plurality of long patterns 31 is arranged substantially parallel to the direction (Y1-Y2 direction) perpendicular to the longitudinal direction (X1-X2 direction). In FIG. 4, the sensitivity direction (direction S) is the direction perpendicular to the longitudinal direction of the long patterns 31. For this reason, the magneto-resistance elements 122a to 122d are arranged so that the directions of the induction field A and the cancellation field B that the magneto-resistance elements 122a to 122d receives are aligned with the direction S. FIG. 4 illustrates a magnetic-field detecting pattern including seven long patterns 31a to 31g. However, the number of long patterns 31 is not limited to seven.

A first end (the left end in FIG. 4) of the outermost long pattern 31a in the array direction of the long patterns 31 is connected to a connection terminal 32a. In contrast, a second end (the right end in FIG. 4) of the long pattern 31g farthest from the long pattern 31a in the array direction of the long pattern 31 is connected to a connection terminal 32b.

A second end of the long pattern 31a and a second end of the long pattern 31b adjacent to the long pattern 31a are connected by a connecting portion 33a, and a first end of the long pattern 31b and a first end of the long pattern 31c adjacent to the long pattern 31b are connected by a connecting portion 33b. Likewise, a second end of the long pattern 31c and a second end of the adjacent long pattern 31d are connected by a connecting portion 33c, and a first end of the long pattern 31d and a first end of the adjacent long pattern 31e are connected by a connecting portion 33d. Thus, the ends of the long patterns 31 are connected to the adjacent long patterns 31 by the connecting portions 33a to 33f to form a meander magnetic-field detecting pattern.

When current flows between the power source (the power-supply voltage Vdd) and the ground (the ground voltage GND) through the meander magnetic-field detecting pattern described above, voltage drop occurs in the meander magnetic-field detecting pattern according to the electrical resistance value. Since the electrical resistance value of the meander magnetic-field detecting pattern varies according to the external magnetic field, the voltage drop in the magnetic-field detecting pattern varies according to the induction field A and the cancellation field B. One of the connection terminals 32a and 32b of the magnetic-field detecting pattern is connected to one of a first output terminal and a second output terminal via a wiring line. This allows providing a voltage value corresponding to the voltage drop generated in the magnetic-field detecting pattern as the first output voltage Out1 or the second output voltage Out2.

As shown in FIG. 3, the feedback coil 121 with a spiral wiring pattern is formed above the magneto-resistance elements 122a to 122d (on the front side in the plane of the drawing, in the Z1-direction) with an insulator film or the like disposed therebetween. The wiring pattern of the feedback coil 121 is disposed so as to partly overlap with the magneto-resistance elements 122a to 122d disposed below (back in the plane of the drawing, the Z2-direction, see FIG. 5A) in plan view in the Z2-direction). The wiring pattern of the feedback coil 121 extends substantially parallel to the extending direction of the long pattern (X1-X2 direction) in the area where overlapping with the magneto-resistance elements 122a to 122d. This allows the feedback coil 121 to generate the cancellation field B in the direction (Y1-Y2 direction) substantially perpendicular to the extending direction of the long pattern. In other words, the direction of the cancellation field B that the magneto-resistance elements 122a to 122d receive is aligned with the sensitivity direction of the magneto-resistance elements 122a to 122d in the area overlapping with the magneto-resistance elements 122a to 122d. In the magnetic sensor 12, the specific configuration of the feedback coil 121 is not limited to the configuration shown in FIGS. 2B and 3.

As shown in FIG. 3, the feedback coil 121 is disposed so as to overlap with the magnetic-field detector 122. The term "disposed so as to overlap" used herein refers to that part of the feedback coil 121 and the magnetic-field detecting unit 122 are disposed so as to overlap with each other as viewed from the direction of normal to an inner shield 124a, that is, from the Z1-direction to the Z2-direction.

As shown in FIG. 2B, the feedback coil 121 may include a first coil portion 121a and a second coil portion 121b. The first coil portion 121a and the second coil portion 121b may be disposed so as to be axisymmetric in shape with respect to a virtual center line CL perpendicular to the Y1-Y2 direction, which is the sensitivity direction of the magneto-resistance elements 122a to 122d, as viewed from the direction of normal to the inner shield 124a. Since the directions of the currents flowing through the first coil portion 121a and the second coil portion 121b are the same in the vicinity of the area overlapping with the magneto-resistance elements 122a to 122d, the directions of the cancellation fields B generated in the first coil portion 121a and the second coil portion 121b are also the same.

As shown in FIG. 2C, the shield 124 may include the inner shield 124a, which is substantially rectangular as viewed from the normal direction (Z1-direction), and an outer shield 124b, which is annular in shape enclosing the inner shield 124a.

As shown in FIG. 3, the flat inner shield 124a formed in an X-Y plane may be disposed so as to cover the magneto-resistance elements 122a to 122d of the magnetic-field detector 122 as viewed from the direction of normal to the inner shield 124a (Z1-direction) to the Z2-direction. This allows the intensity of the induction field A due to the current I applied to the magnetic-field detecting unit 122 to be decreased by the inner shield 124a.

The outer shield 124b may be disposed so as to overlap with the feedback coil 121 along the outer periphery of the feedback coil 121 so as to enclose the inner shield 124a as viewed from the direction of normal to the inner shield 124a. The inner shield 124a and the outer shield 124b are disposed in the same plane. The inner shield 124a and the outer shield 124b can be formed by the same process using a high magnetic permeability material or the like. In this case, the inner shield 124a and the outer shield 124b may have the same thickness.

Since the outer shield 124b overlaps with the feedback coil 121, the saturation magnetic field can be increased by the cancellation field, as will be described later. For the shield 124, the saturation magnetic field of the outer shield 124b can be made larger than the saturation magnetic field of the inner shield 124a by making the width W2 of the outer shield 124b smaller than the width W1 of the inner shield 124a. This increases the apparent anisotropy field of the inner shield 124a. The width W1 of the inner shield 124a refers to the distance of the rectangle in the crosswise direction, and the width W2 of the outer shield 124b is the width of the annulus. In this embodiment, both of the width W1 and the width W2 are the length the magnetic-field detector 122 in the sensitivity direction (Y1-Y2 direction).

The feedback coil 121 may be disposed so that the first coil portion 121a and the second coil portion 121b are axisymmetric with respect to the virtual center line CL. This facilitates disposing the outer shield 124b along the outer periphery of the feedback coil 121 as viewed from the direction of normal to the inner shield 124a, that is, disposing the outer shield 124b so as to overlap with the outer periphery (outer shell) of the feedback coil 121 as viewed in the laminating direction (Z1-Z2 direction).

The configuration in which the outer shield 124b of the shield 124 is disposed so as to overlap with the feedback coil 121 allows the saturation magnetic field of the outer shield 124b to be increased using the cancellation field. This reduces the magnetic field to be applied to the inner shield 124a effectively using the outer shield 124b, thereby increasing the apparent Hk of the inner shield 124a.

In the area overlapping with the magneto-resistance elements 122a to 122d, the inner shield 124a is disposed above the feedback coil 121 (on the front side in the plane of drawing, in the Z1-direction). Around the inner shield 124a, the outer shield 124b spaced apart from the inner shield 124a is disposed.

The outer shield 124b is disposed in annular shape around the inner shield 124a. In other words, the outer shield 124b are disposed continuously and seamlessly so as to be spaced apart from the inner shield 124a in the directions of the induction field A and the cancellation field B (see FIG. 1, in the Y1-Y2 direction), that is, the sensitivity direction of the magneto-resistance elements 122a to 122d and the direction perpendicular thereto (X1-X2 direction). This allows reducing disturbance magnetic fields in the sensitivity direction and the direction perpendicular to the sensitivity direction, thereby increasing the apparent Hk of the inner shield 124a.

Figure 5A:
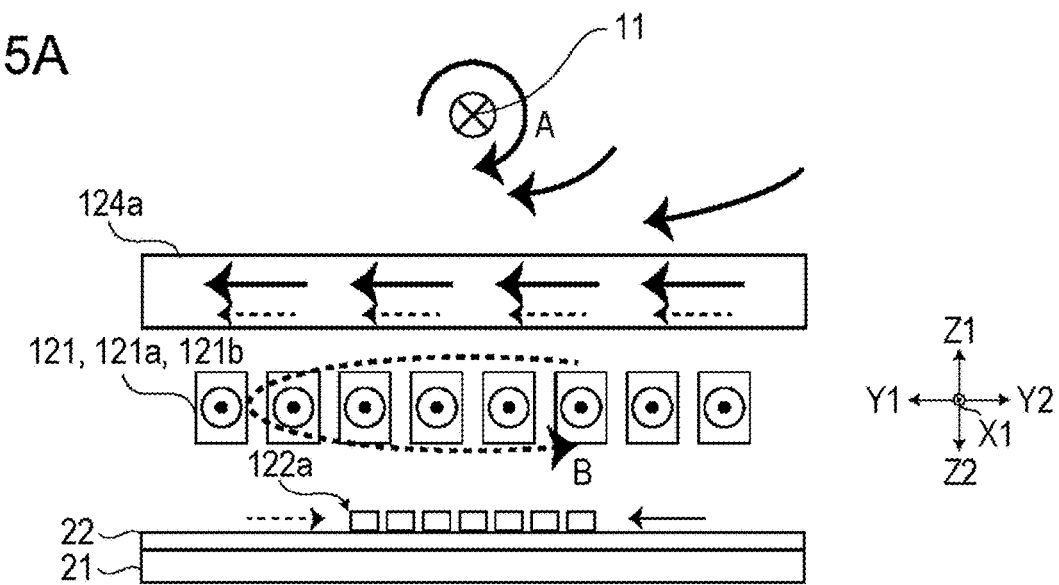
FIG. 5A is a schematic cross-sectional view of the magnetic sensor in FIG. 3 taken along line VA-VA.
Figure 5B:
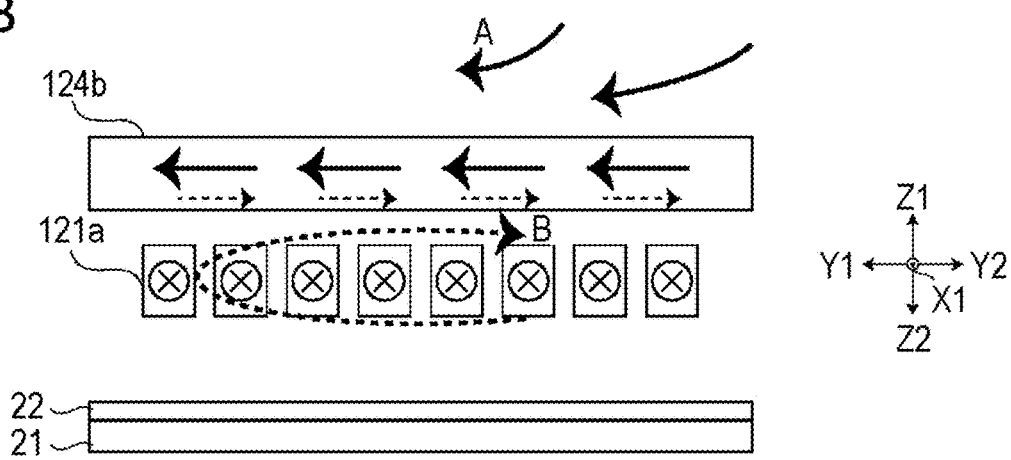
FIG. 5B is a schematic cross-sectional view of the magnetic sensor in FIG. 3 taken along line VB-VB.
Figure 5C:
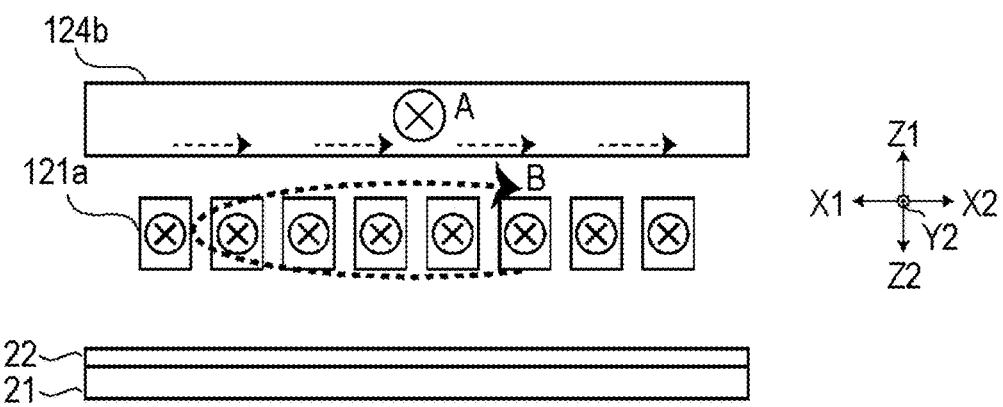
FIG. 5C is a schematic cross-sectional view of the magnetic sensor in FIG. 3 taken along line VC-VC.

FIGS. 5A, 5B, and 5C are schematic cross-sectional views of the magnetic sensor 12 in FIG. 3 taken along line VA-VA, line VB-VB, and VC-VC, respectively. These schematically illustrate the lamination structure of the magnetic balanced magnetic sensor 12.

FIG. 5A illustrates a cross section including the first coil portion 121a, the second coil portion 121b, the magneto-resistance element 122a, and the inner shield 124a. FIGS. 5B and 5C illustrate cross-sections including the first coil portion 121a and the outer shield 124b. These drawings illustrate the structure in simplified manner to illustrate the entire lamination structure, in which part of the structure is omitted.

As shown in FIG. 5A, the magneto-resistance element 122a is disposed on an insulator film 22 formed on a substrate 21 that contains silicon. The first coil portion 121a and the second coil portion 121b (referred to as "feedback coil 121" as appropriate) are disposed above the magneto-resistance element 122a (in the Z1-direction) with a polyimide film and a silicon oxide film disposed therebetween (not shown). The feedback coil 121 can be formed by forming a film containing an electrically conductive material, such as metal, and thereafter patterning the film using photolithography and etching.

The inner shield 124a is formed in the area overlapping with the magneto-resistance element 122a in plan view in the Z2-direction, with a polyimide film (not shown) that covers the feedback coil 121 therebetween. The inner shield 124a may be made of a high magnetic permeability material, such as an amorphous magnetic material, a permalloy-based magnetic material, or an iron-based microcrystalline material. A silicon oxide film (not shown) is formed on the inner shield 124a.

In FIGS. 5A and 5B, the induction field A from the conductor 11 is indicated by the solid arrows, and the cancellation field B from the first coil portion 121a is indicated by the dashed arrow.

As shown in FIG. 5A, in the inner shield 124a, the direction of the induction field A and the direction of the cancellation field B of the feedback coil 121 are the same. For this reason, the inner shield 124a of the magnetic sensor 12 has a function for enhancing the cancellation field B of the feedback coil 121, in addition to attenuating the magnetism. Since the inner shield 124a functions as a magnetic yoke, the current to the feedback coil 121 can be decreased to save power consumption.

As shown in FIG. 5B, in the outer shield 124b, the direction of the induction field A and the direction of the cancellation field B of the first coil portion 121a are opposite. Thus, the cancellation field B cancels the induction field A in the outer shield 124b, which makes it difficult to cause magnetization saturation in the outer shield 124b. This can increase the saturation magnetic field of the outer shield 124b, thereby effectively shielding and reducing the magnetic field in the detecting direction (Y1-Y2 direction). This allows increasing the apparent anisotropy field (Hk) of the inner shield 124a to increase the measurable range of the magnetic sensor 12.

While FIG. 5B illustrates a VB-VB cross section, also in the VB2-VB2 cross section, the relationship between the direction of the induction field A and the direction of the cancellation field B, that is, the direction of the induction field A and the direction of the cancellation field B of the second coil portion 121b (see FIG. 3) are opposite, as in FIG. 5B. This allows reducing the magnetic field to be applied to the inner shield 124a using the outer shield 124b regardless of the direction (Y1-direction or Y2-direction) of the magnetic field in the detecting direction (Y1-Y2 direction).

As shown in FIG. 5C, the induction field A and the cancellation field B of the first coil portion 121a cross at right angles at a portion of the outer shield 124b positioned in the direction (X1-X2 direction) perpendicular to the detecting direction with respect to the inner shield 124a. While FIG. 5C illustrate a VC-VC cross section, the induction field A and the cancellation field B of the second coil portion 121b cross at right angles also in an VC2-VC2 cross-sectional view. This also allows reducing the disturbance magnetic field to be applied to the inner shield 124a with the outer shield 124b regardless of the direction of the magnetic field (X1-X2 direction) perpendicular to the detecting direction. The direction of the cancellation field B in the VC2-VC2 cross-sectional view is opposite from the direction in FIG. 5C.

Figure 6A:
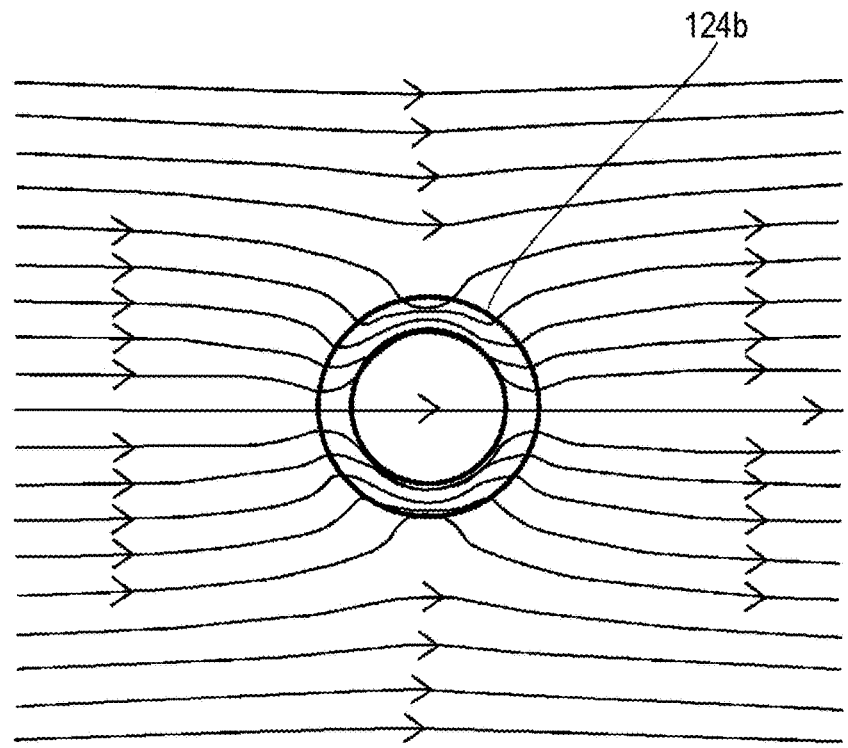
FIG. 6A is a schematic diagram illustrating the magnetic field around an annular outer shield.
Figure 6B:
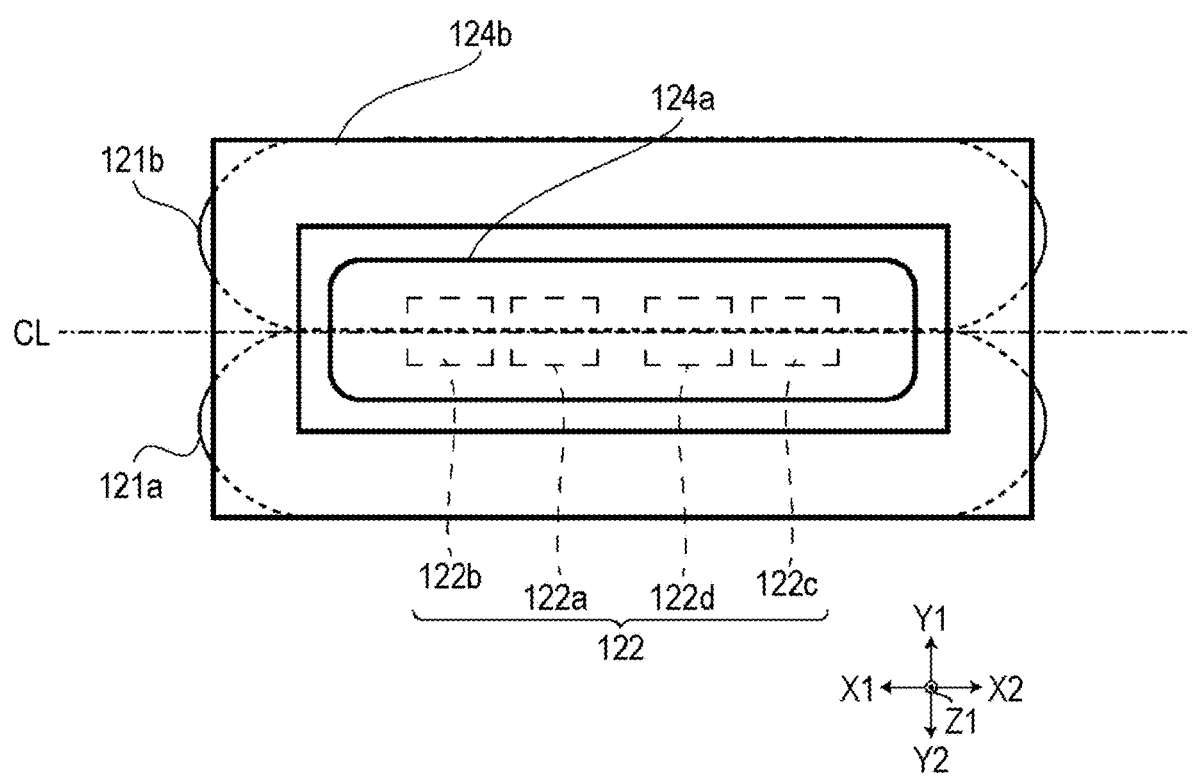
FIG. 6B is a schematic diagram illustrating the magnetic-field detector, the feedback coil, and the shield according to the first embodiment.

FIG. 6A is a schematic diagram illustrating the magnetic field around an annular outer shield 124b. FIG. 6B is a schematic diagram illustrating the arrangement of the magnetic-field detector 122, the feedback coil 121, and the shield 124 of the magnetic sensor 12.

The annular shape of the outer shield 124b as shown in FIG. 6A allows for attenuating and reducing the transverse magnetic field perpendicular to the detecting direction extending in the magnetic-field detector 122 and attenuating and reducing a magnetic field from outside extending to the inner shield 124a positioned inside. This can increase the apparent anisotropy field (Hk) of the inner shield 124a.

As shown in FIG. 6B, the four magneto-resistance elements 122a to 122d constituting a full-bridge circuit in the magnetic-field detector 122 are arranged so as to be aligned with the virtual center line CL and in line along the virtual center line CL as viewed from the direction of normal to the inner shield 124a. The feedback coil 121 and the shield 124 are individually disposed wo as to be axisymmetric with respect to the virtual center line CL. For this reason, the positional relationship between the feedback coil 121 and the shield 124 and the magnetic-field detector 122 are the same in the Y1-direction and the Y2-direction in the sensitivity direction in which the induction field A is detected. This allows detecting the induction field A with the same accuracy regardless of whether the direction of the magnetic field is the Y1-direction or the Y2-direction. In other words, the current I can be detected regardless of the direction of the current flowing through the conductor 11.

Figure 7A:
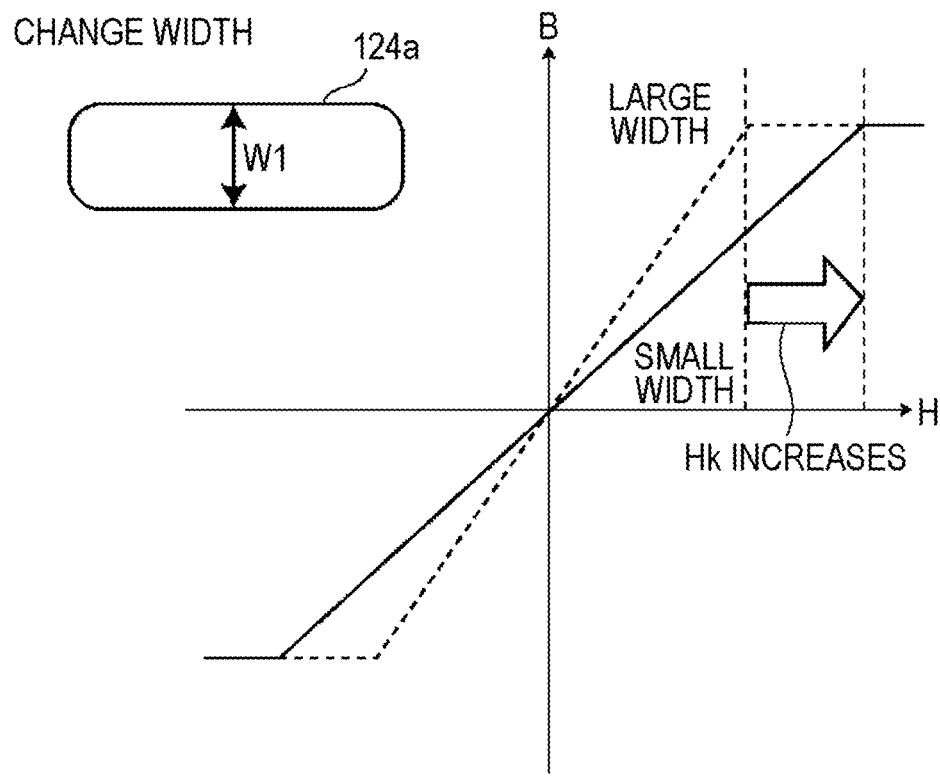
FIG. 7A is a graph schematically showing the relationship between the width of the inner shield and the anisotropy field (Hk)
Figure 7B:
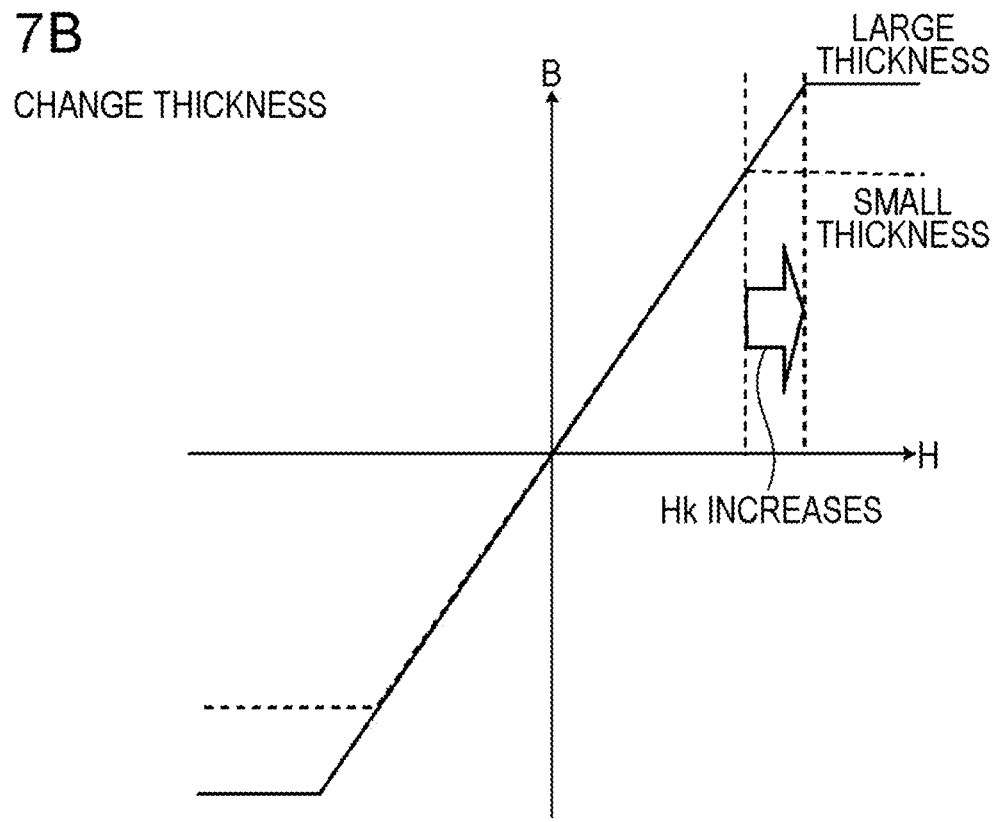
FIG. 7B is a graph schematically showing the relationship between the thickness of the inner shield and the anisotropy field (Hk)

FIG. 7A is a graph schematically showing the relationship between the width (W1) of the inner shield 124a and the anisotropy field (Hk). FIG. 7B is a graph schematically showing the relationship between the thickness of the inner shield 124a and the anisotropy field (Hk).

To increase the measurable range (dynamic range) of the magnetic sensor 12 (see FIG. 3), the anisotropy field (Hk) of the inner shield 124a needs to be increased. To do this, it is effective to increase the aspect ratio of the (rectangular) shape of the inner shield 124a viewed from the normal direction, as shown in FIG. 7A, or increase the thickness of the inner shield 124a, as shown in FIG. 7B.

However, in increasing the aspect ratio of the inner shield 124a, the size in the crosswise direction (the width direction, the sensitivity direction, or the Y1-Y2 direction) is limited in view of the positions of the magneto-resistance elements 122a to 122d (FIGS. 3 and 6). Furthermore, increasing the aspect ratio has the disadvantage of decreasing the permeability (μ) of the inner shield 124a as a contradictory or conflicting property, decreasing the effect of shielding the induction field A.

Increasing the thickness of the inner shield 124a poses the issue of significant difficulty in production. Example disadvantages of the large thickness include that it is difficult to uniformly apply a thick resist into the wafer and that cracks and coming-off of the film with an increase in the stress of the shield 124 are likely to occur.

For these reasons, the magnetic sensor 12 of this embodiment includes the outer shield 124b disposed flush with the inner shield 124a so as to enclose the inner shield 124a along the outer periphery of the feedback coil 121 as viewed from the direction of normal to the inner shield 124a (Z1-direction) to produce a high shielding effect on the induction field A without increasing the thickness of the shield 124.

Modification

Figure 8:
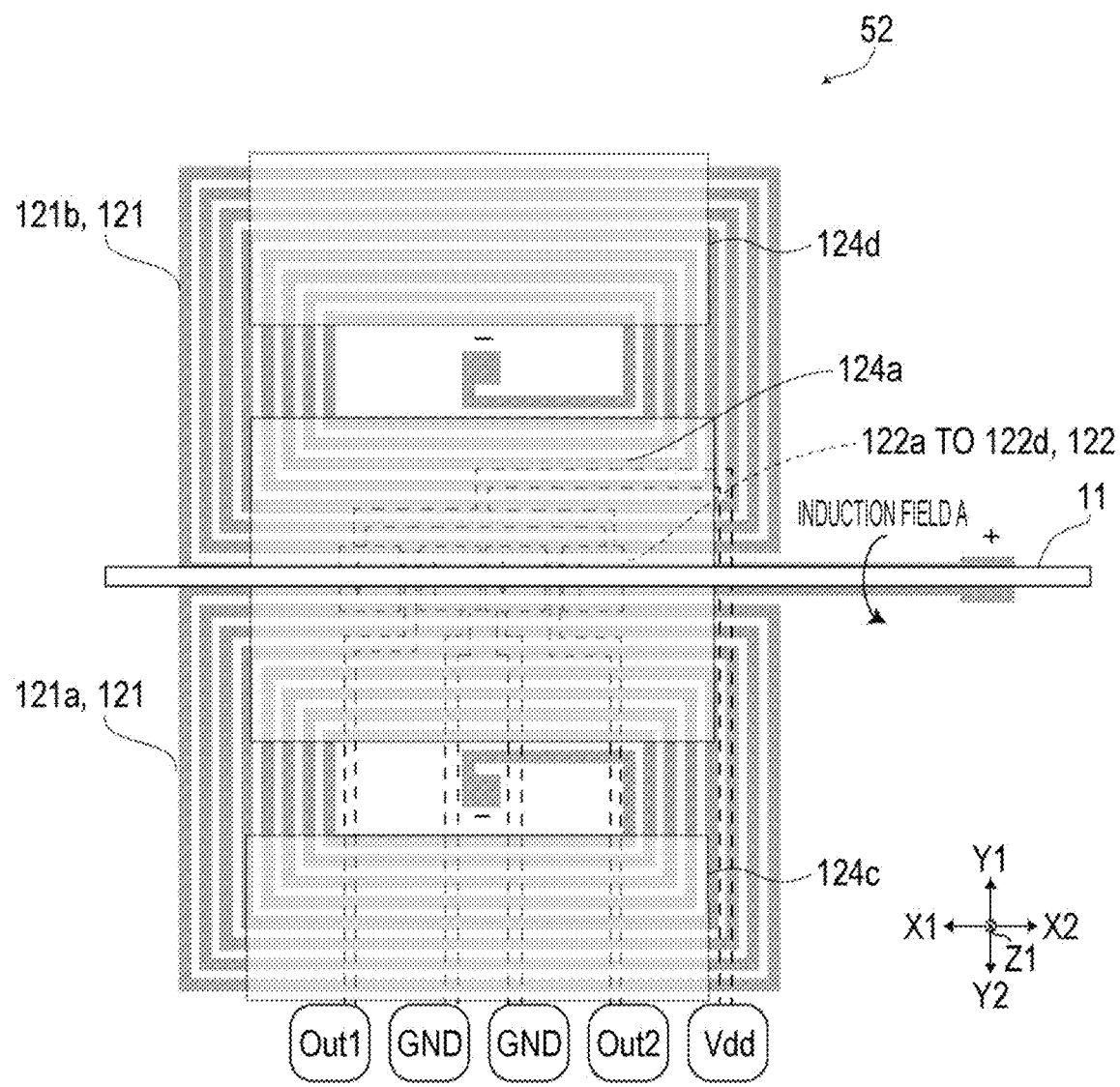
FIG. 8 is a plan view of a magnetic sensor according to a modification of the first embodiment illustrating the configuration thereof.

FIG. 8 is a plan view of a magnetic balanced magnetic sensor 52 according to a modification of the embodiment shown in FIG. 3 illustrating the configuration thereof. The magnetic sensor 52 of this modification differs from the magnetic sensor 12 in including outer shields 124c and 124d that surround the inner shield 124a on opposite sides in the magnetic-field detecting direction of the magnetic sensor 52, in place of the annular outer shield 124b that encloses the inner shield 124a of the shield 124 (see FIG. 2) seamlessly, and is the same in the other configurations.

The outer shields 124c and 124d are disposed outside spaced apart from the inner shield 124a in the magnetic-field detecting direction (Y1-Y2 direction) of the magneto-resistance elements 122a to 122d. In other words, the outer shields 124c and 124d are disposed away from the inner shield 124a in the directions of the induction field A and the cancellation field B.

Disposing the outer shields 124c and 124d outside the magneto-resistance elements 122a to 122d in the magnetic-field detecting direction so as to overlap with the feedback coil 121 makes it difficult to cause magnetization saturation, as with the outer shield 124b. This allows decreasing the magnetic field from outside to the inner shield 124a with the outer shields 124c and 124d to increase the apparent anisotropy field (Hk) of the inner shield 124a, thereby increasing the measurable range of the magnetic sensor 52.

Second Embodiment

Figure 12A:
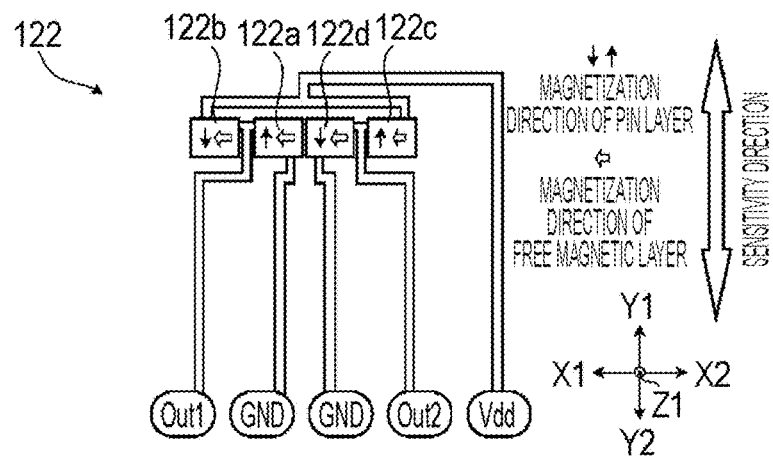
FIG. 12A is a plan view of a magnetic-field detector of a magnetic sensor according to a second embodiment.
Figure 12B:
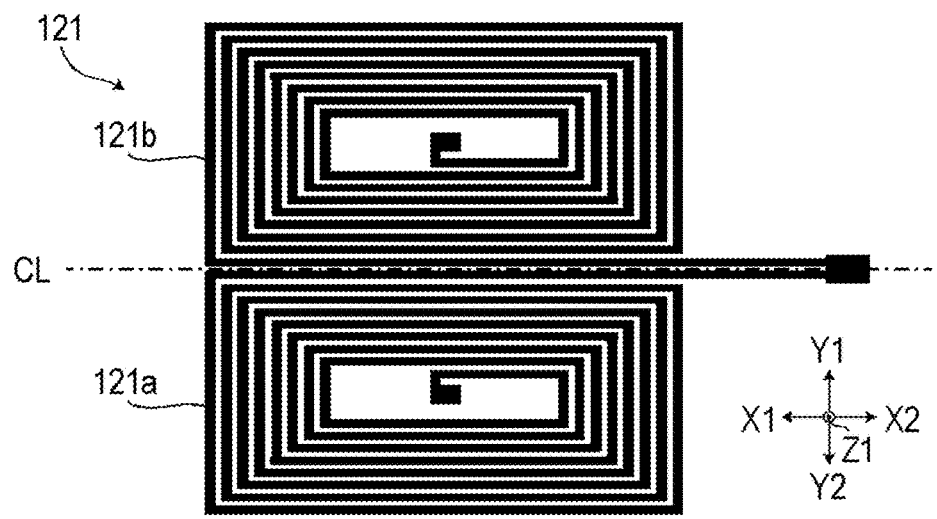
FIG. 12B is a plan view of a feedback coil of the magnetic sensor according to the second embodiment.
Figure 12C:
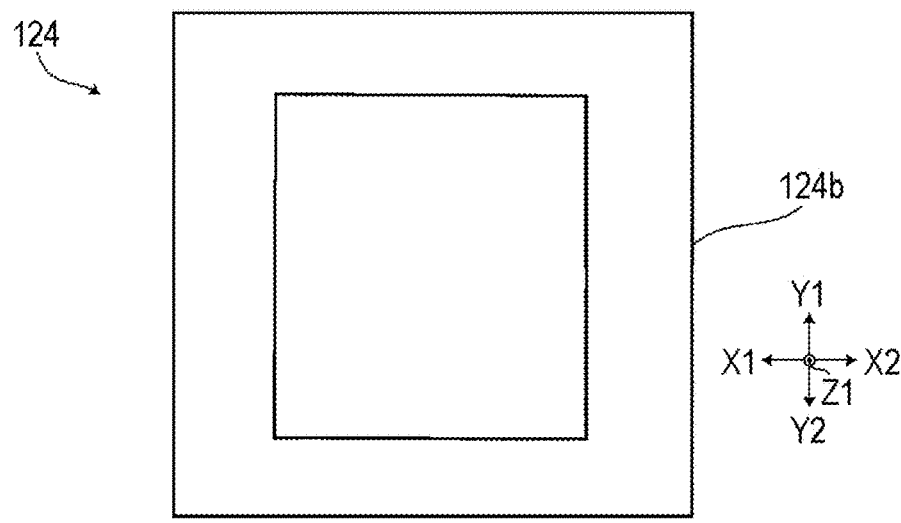
FIG. 12C is a plan view of a shield of the magnetic sensor according to the second embodiment.

FIGS. 12A, 12B, and 12C are plan views of a magnetic-field detector 122, a feedback coil 121, and a shield 124 of a magnetic sensor 13 according to this embodiment, respectively.

Figure 13:
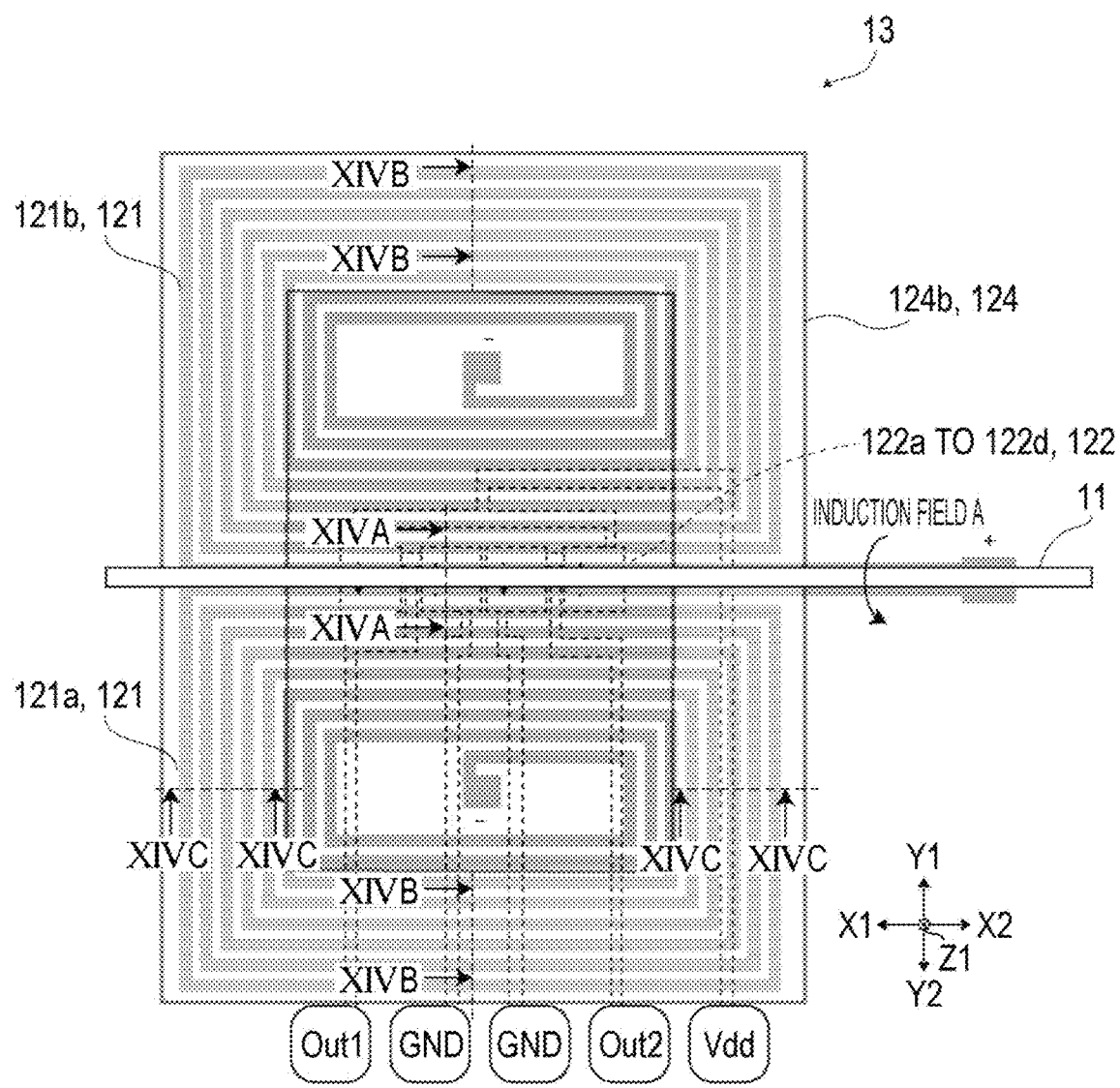
FIG. 13 is a plan view of the magnetic sensor according to the second embodiment illustrating the configuration thereof.

FIG. 13 is a plan view of the magnetic sensor 13 according to this embodiment illustrating the configuration thereof, which schematically illustrates the positional relationship among the components shown in FIGS. 12A to 12C in a layered state.

As shown in FIGS. 12A to 12C and FIG. 13, the magnetic sensor 13 of this embodiment has the same configuration as that of the magnetic sensor 12 of the first embodiment except that the shield 124 is formed of an annular outer shield 124b. For this reason, descriptions of the configuration common to that of the magnetic sensor 12 will be omitted in this embodiment, and the different configuration will be described.

The shield 124 (the outer shield 124b) improves the resistance to the transverse magnetic field of the magnetic sensor 13 using a shield effect on the magnetic field in the direction perpendicular to the sensitivity direction. First, an offset caused in the resistance of the magnetic-field detector 122 when a transverse magnetic field is applied to the magnetic sensor 13 will be describe hereinbelow.

Figure 19:
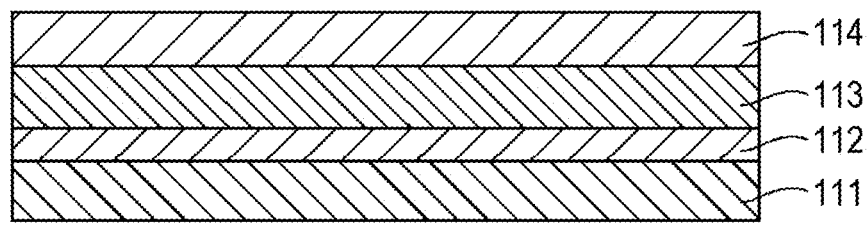
FIG. 19 is a cross-sectional view of the GMR element schematically illustrating the lamination structure.

FIG. 19 is a cross-sectional view of the magneto-resistance elements 122a to 122d made of GMR elements schematically illustrating the lamination structure. The magneto-resistance elements 122a to 122d have a configuration in which a fixed magnetic layer 111, a nonmagnetic material layer 112, a free magnetic layer 113, and an antiferromagnetic layer 114 are laminated. Their resistance values vary with the relative relationship in the direction of magnetization between the fixed magnetic layer 111 whose direction of magnetization is fixed and the free magnetic layer 113 whose direction of magnetization changes with the external magnetic field. The magnetic sensor 13 (see FIG. 13) can detect the direction and intensity of the external magnetic field based on the change in the resistance value.

When the magnetic domain wall moves in the free magnetic layer 113, Barkhausen noise is generated. For this reason, an exchange bias magnetic field using a magnetic field of exchange coupling with the antiferromagnetic layer 114 is applied in a direction perpendicular to the sensitivity axis as a bias magnetic field for stabilizing the output of the magnetic sensor 13 including the magneto-resistance elements (GMR elements) 122. The application of the bias magnetic field allows the direction of magnetization of the soft magnetic material that forms the free magnetic layer 113. The bias magnetic field is not limited to the exchange bias magnetic field but may be a hard bias magnetic field using a permanent magnet.

When a weak external magnetic field, which does not invert the direction of magnetization, is applied, the free magnetic layer 113 returns to the initial state before the external magnetic field is applied by returning to a zero magnetic field. However, when a strong external magnetic field, which inverts the direction of magnetization, is applied, the free magnetic layer 113 does not return to the initial state even if it is returned to the zero magnetic field. In other words, when the direction of magnetization of the free magnetic layer 113 is inverted by the strong external magnetic field, the hysteresis of the free magnetic layer 113 causes offset from the initial state even if the external magnetic field is removed, so that the free magnetic layer 113 returns to the zero magnetic field.

Figure 20:
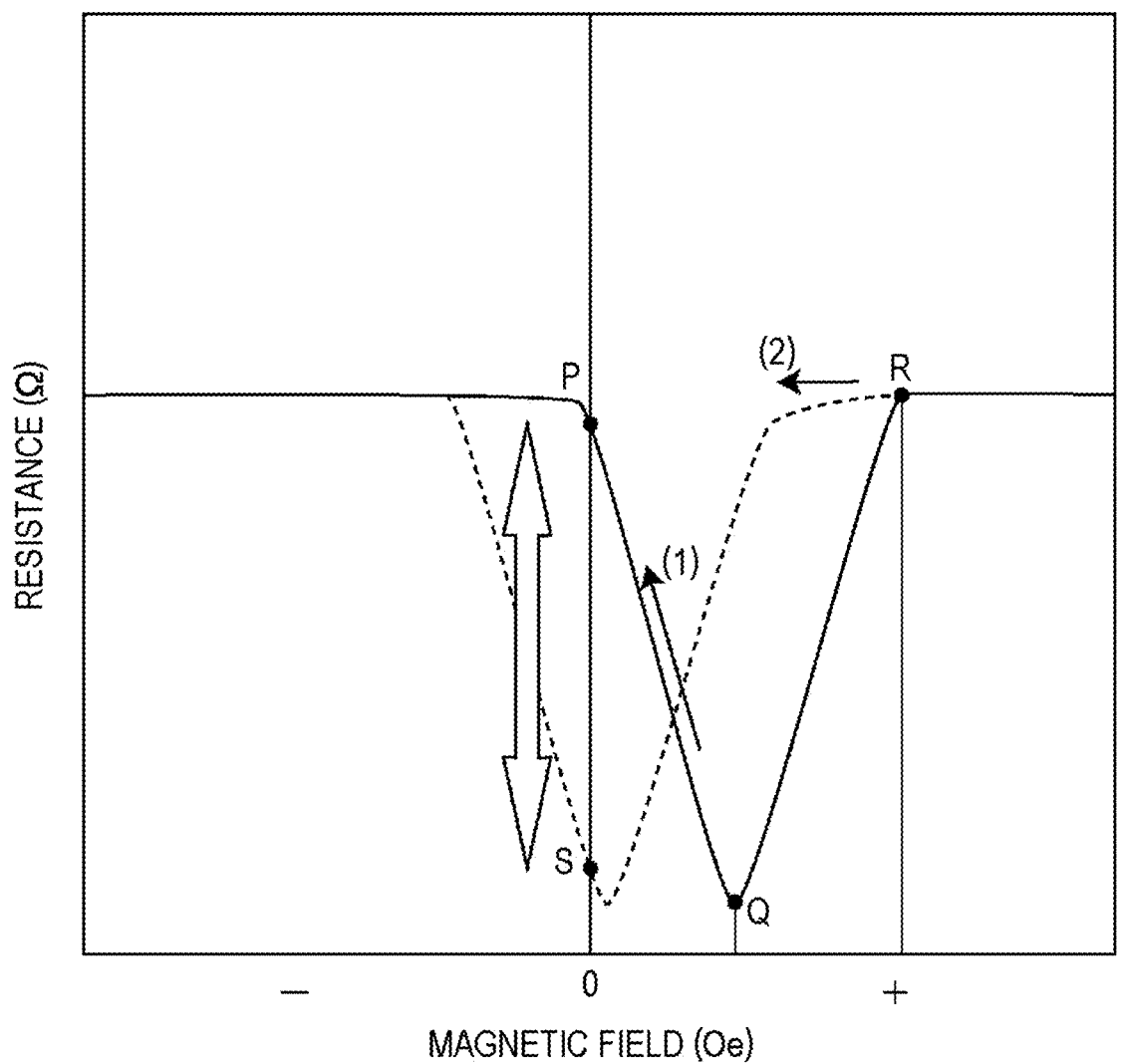
FIG. 20 is an explanatory diagram illustrating the offset of the resistance due to the hysteresis of the free magnetic layer of the magneto-resistance element.

FIG. 20 is an explanatory diagram illustrating the offset of the resistance due to the hysteresis of the free magnetic layer 113 of the magneto-resistance elements 122a to 122d. As illustrated in the drawing, in the case where the external magnetic field (transverse magnetic field) applied to the free magnetic layer 113 in the direction perpendicular to the sensitivity axis is smaller an inverse magnetic field (Q), when the external magnetic field returns to zero, the free magnetic layer 113 changes in the direction of arrow (1) along the solid line into the initial state, as shown in the drawing. Therefore, in the case where the intensity of the external magnetic field is from 0 to less than the inverse magnetic field, when the external magnetic field becomes zero, the resistance of the free magnetic layer 113 returns to the initial value (P).

However, when an external magnetic field stronger or equal to the inverse magnetic field is applied, the free magnetic layer 113 does not return to the initial state even if the external magnetic field returns to zero. For example, when a saturation magnetic field (R) is applied to the free magnetic layer 113, the resistance is changed by the hysteresis of the free magnetic layer 113, as indicated by the dashed line. For this reason, when the external magnetic field becomes zero, the resistance of the free magnetic layer 113 changes in the direction of arrow (2) along the dashed line into (S). Thus, in the case where the intensity of the external magnetic field is higher than or equal to the inverse magnetic field, the resistance of the free magnetic layer 113 is shifted from the initial value by the hysteresis of the free magnetic layer 113.

As described above, when an external magnetic field stronger than the inverse magnetic field is applied, so that the free magnetic layer 113 is inverted from the initial direction of magnetization, an offset occurs in the resistance of the free magnetic layer 113 after the external magnetic field becomes zero. The offset of the resistance in the free magnetic layer 113 varies with the intensity of the external magnetic field in the range indicated by the open arrow shown in FIG. 20. Since the variation in the resistance of the free magnetic layer 113 decreases the detection accuracy, the magnetic sensor 13 preferably has high resistance to the external magnetic field perpendicular to the sensitivity axis.

The magnetic sensor 13 includes the shield 124 to attenuate the external magnetic field to increase the detection accuracy. The external magnetic field is applied to the magnetic-field detector 122 while being attenuated by the shield 124. This causes the inverse magnetic field to shift to a higher magnetic field to increase the range in which the detection accuracy of the magnetic sensor can be kept high.

As shown in FIG. 13, the shield 124 is disposed so as to overlap with the feedback coil 121 along the outer periphery of the feedback coil 121 as viewed from the direction of normal, that is, from the Z1-direction to the Z2-direction. The shield 124 preferably covers the outer periphery of the feedback coil 121 completely but may cover not the whole but part of the outer periphery. The shield 124 may cover part of the outer periphery of the feedback coil 121, and the part may extend from the feedback coil 121 as viewed from the normal direction.

Figure 14A:
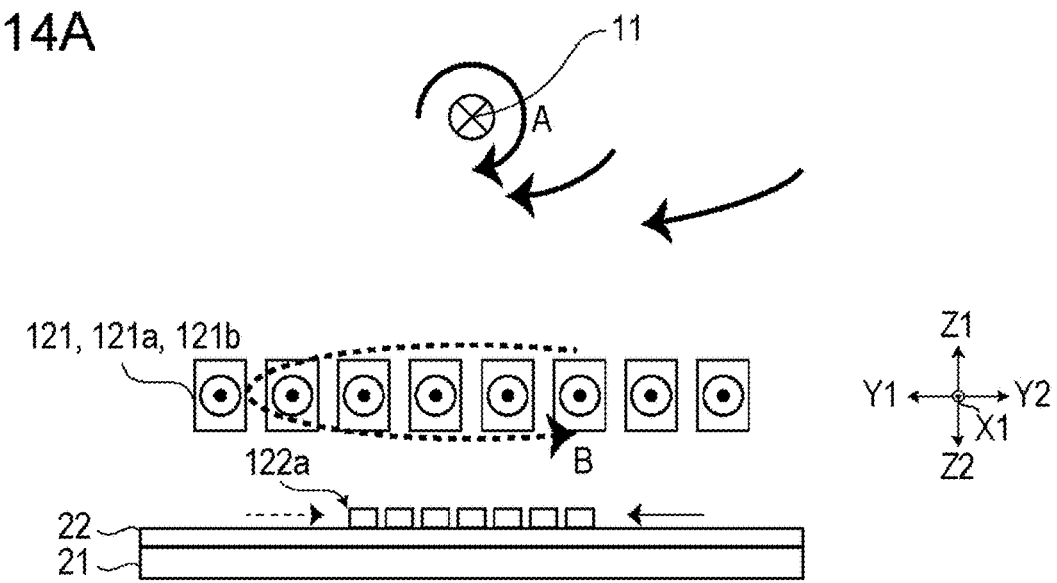
FIG. 14A is a schematic cross-sectional view of the magnetic sensor in FIG. 13 taken along line XIVA-XIVA.
Figure 14B:
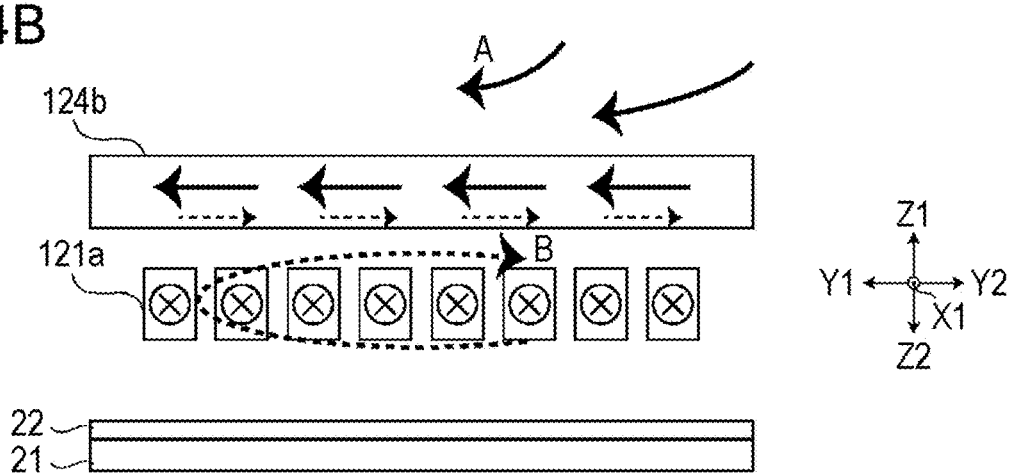
FIG. 14B is a schematic cross-sectional view of the magnetic sensor in FIG. 13 taken along line XIVB-XIVB.
Figure 14C:
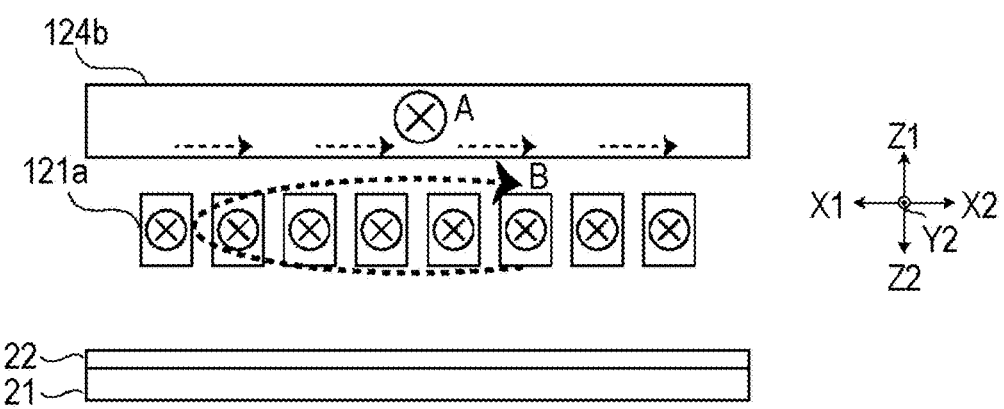
FIG. 14C is a schematic cross-sectional view of the magnetic sensor in FIG. 13 taken along line XIVC-XIVC.

FIGS. 14A, 14B, and 14C are schematic cross-sectional views of the magnetic sensor 13 in FIG. 13 taken along line XIVA-XIVA, line XIVB-XIVB, and line XIVC-XIVC, respectively. These diagrams schematically illustrate the lamination structure of the magnetic balanced magnetic sensor 13, in which the induction field A from the conductor 11 is indicated by the solid arrows, and the cancellation field B from the first coil portion 121a are indicated by the dashed arrow.

As shown in FIG. 14A, the magnetic sensor 13 does not include the inner shield 124a (see FIGS. 2C and 3) between the conductor 11 and the feedback coil 121. The inner shield 124a is indispensable in detecting a wide magnetic field range but is not indispensable in detecting a relatively small magnetic field range.

For example, in the case where the magnetic-field detector 122 is a GMR element, the presence of the inner shield 124a causes the magnetic-field detecting unit 122 to be susceptible to the influence of the hysteresis of the inner shield 124a. For this reason, if a desired detection range can be ensured, the inner shield 124a is preferably omitted as is the magnetic sensor 13. Accordingly, some balanced magnetic sensors (current sensors) for detected a weak magnetic field include only a feedback coil and a full-bridge circuit constituted of a GMR element.

However, the magnetic sensor constituted of only the full-bridge circuit and the balanced coil have the issue of being susceptible to the influence of a disturbance magnetic field. It is also possible that the magnetic sensor element (chip) alone does not have a function for attenuating a disturbance magnetic field and that a shield is disposed in the package or module. However, this has the problem of complicating the structure and increasing the size to makes it difficult to miniaturize the product.

The shield 124 also has the effect of attenuating the disturbance magnetic field, which is a component other than the detection magnetic field. For this reason, the magnetic sensor 13 includes an outer shield 124b as a shield 124 for reducing the influence of the disturbance magnetic field. The magnetic sensor 13 contains in its chip the shield for attenuating the disturbance magnetic field, which is advantageous in size reduction. The outer shield 124b is disposed not directly above the magnetic-field detector 122 constituting the full-bridge circuit but at a slightly remote location so as to enclose it. This can reduce the influence of the hysteresis of the shield 124 on the magnetic sensor 13.

Figure 15A:
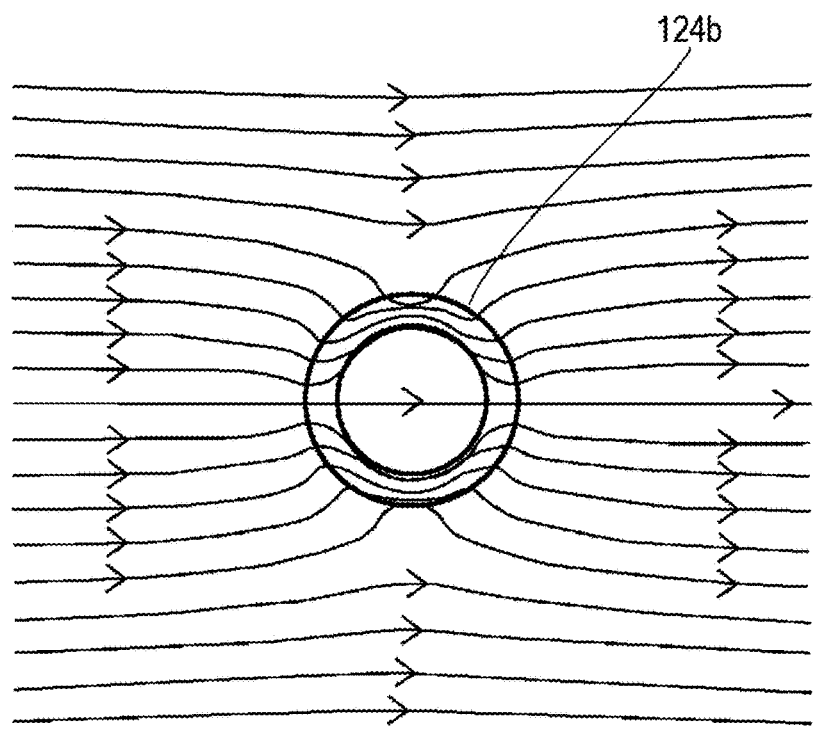
FIG. 15A is a schematic diagram illustrating the magnetic field around an annular outer shield.
Figure 15B:
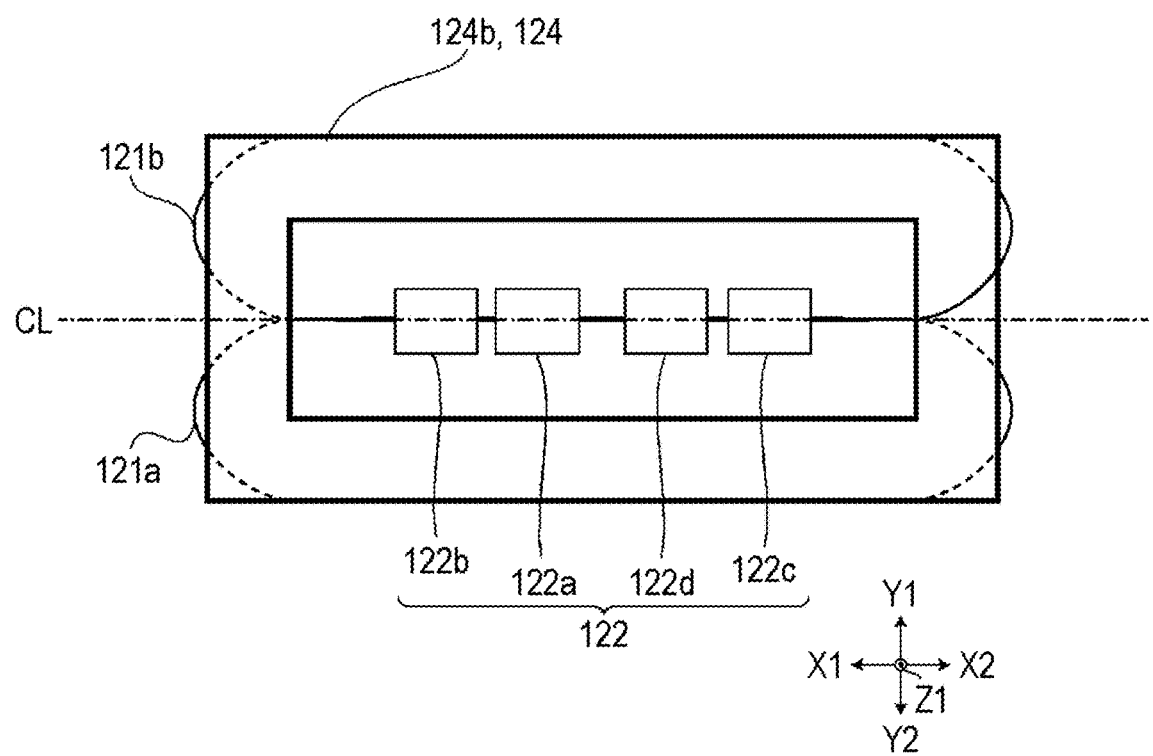
FIG. 15B is a schematic diagram illustrating a magnetic-field detector, a feedback coil, and a shield according to the second embodiment.

FIG. 15A is a schematic diagram illustrating the magnetic field around the annular outer shield 124b. FIG. 15B is a schematic diagram illustrating the arrangement of the magnetic-field detector 122, the feedback coil 121, and the shield 124 of the magnetic sensor 13.

As shown in FIG. 15A, the annular shape of the outer shield 124b reduces the influence of the peripheral magnetic field on the inner area. In other words, disposing the magnetic-field detector 122 inside the annular outer shield 124b can attenuate and reduce the magnetic field from outside extending to the magnetic-field detector 122. This improves the resistance of the magnetic sensor 13 to the external magnetic field.

As shown in FIG. 15B, the magnetic-field detecting unit 122 and the feedback coil 121 are disposed so as to be axisymmetric with respect to the virtual center line CL, and the shield 124 constituted of the ring-shaped outer shield 124b is disposed above the feedback coil 121 (on the Z2 side of the Z1-Z2 axis) so as to enclose them. This allows the induction field A and the current I to be detected with high accuracy regardless of the direction of the current flowing through the conductor 11.

EXAMPLES

Examples 1 to 2 and Comparative Example 1

In Example 1, the magnetic sensor 12 with the configuration of the embodiment (see FIG. 3), and in Example 2, the magnetic sensor 52 (see FIG. 8) with the configuration of the modification measured the magnetic force, and the linearity was evaluated.

FIG. 9 is a plan view of a magnetic sensor according to Comparative Example 1 illustrating the configuration thereof. In Comparative Example 1, a current sensor in which a coil portion and a shield are overlapped with a magnetic-field detecting bridge circuit including four magneto-resistance elements shown in the drawing was used to measure the magnetic force and evaluate the linearity.

Conditions common to the current sensors of Examples 1 and 2 and Comparative Example 1 are as follows:
  Material of shield: NiFe alloy (19.5 wt % Fe)
  Size of inner shield directly above magnetic-field detector (Examples 1 and 2) and shield (Comparative Example 1): 800 µm×150 µm
  Thickness of inner shield (Examples 1 and 2) and shield (Comparative Example 1): 17 µm
  Distance between magnetic-field detector and shield (Z1-Z2 direction): 10 µm
  Number of turns of feedback coil above magnetic-field detecting unit, that is, area overlapping with magnetic-field detecting unit: 24

Figure 10:
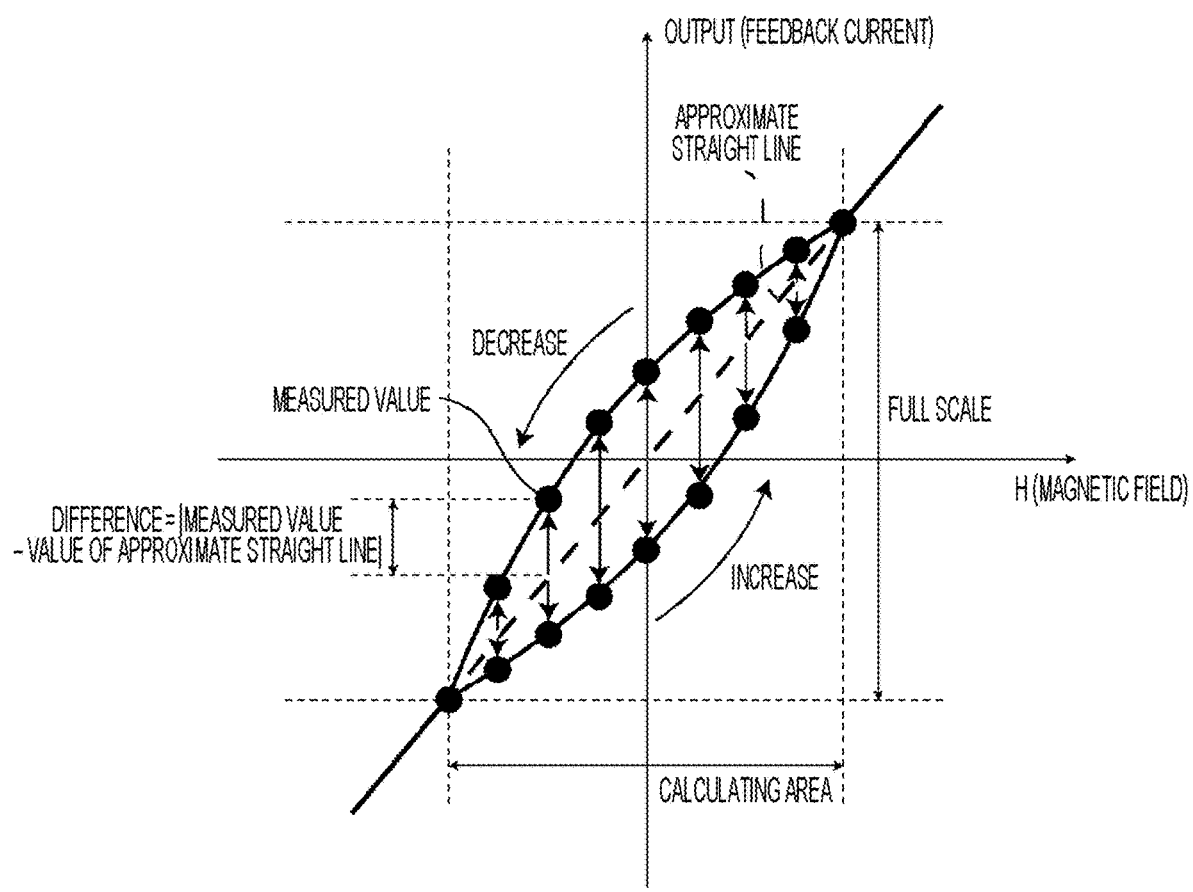
FIG. 10 is a graph schematically showing a method of calculating the linearity in Examples 1 and 2.

FIG. 10 is a graph schematically showing a method of calculating the output linearity of the magnetic sensor. The linearity was defined using the ratio of the difference (the maximum value) between the measured value of the output and the approximate straight line to the full scale (%/F.S.). This definition shows that the lower the value of the linearity (%/F.S.), the closer to an ideal straight line and the higher the accuracy of the magnetic sensor.

The horizontal axis of the graph in the drawing represents a magnetic field, and the vertical axis represents a feedback current. As indicated by the solid lines in the drawing, the measured value of the feedback current differs because of the hysteresis between the cases in which the magnetic field increases and decreases. So, the linearity of the magnetic sensor was obtained by obtaining an approximate straight line from the measured values by least square approximation, obtaining the maximum value of the absolute value of the difference between the measured value and the value of the approximate straight line, that is, a value obtained by subtracting a value obtained from the approximate straight line in the same magnetic field as that of the measured value from the measured value, and calculating the ratio of the maximum value to the full scale. The full scale (F.S.) refers to the difference in feedback current between the minimum magnetic field and the maximum magnetic field in the range of the magnetic field in which the linearity was calculated.

Figure 11:
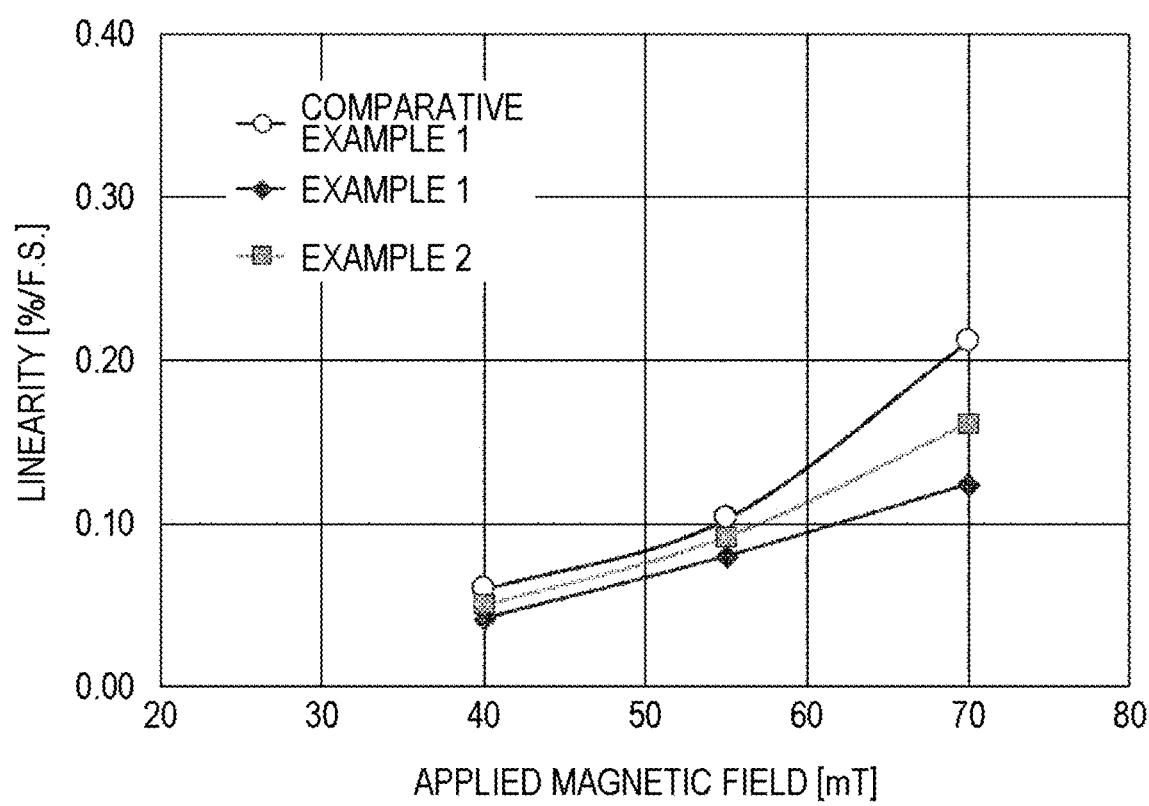
FIG. 11 is a graph showing the results of evaluation of the linearity of the magnetic sensors of Examples 1 and 2 and Comparative Example 1.

The results of evaluation of the linearity of the magnetic sensors of Examples 1 and 2 and Comparative Example 1 are shown in the graph of FIG. 11 and Table 1.

TABLE 1

|  | Linearity (%/F.S.) | | |
| --- | --- | --- | --- |
|  | ±40 mT | ±55 mT | ±70 mT |
| Example 1 | 0.042 | 0.080 | 0.124 |
| Example 2 | 0.050 | 0.092 | 0.161 |
| Comparative Example 1 | 0.060 | 0.103 | 0.211 |

The results of evaluation of the linearity of the magnetic sensors in Examples 1 and 2 and Comparative Example 1 showed that the configuration in which the shield overlapped with the feedback coil is constituted of an inner shield disposed so as to decrease the intensity of the magnetic field to be measured to be applied to the magnetic-field detector and an outer shield disposed so as to decrease the intensity of the magnetic field to be measured to be applied to the inner shield allows the induction field A to be detected with high accuracy. The results also showed that the seamless annular outer shield is more preferable than the outer shield that surrounds the inner shield on the opposite sides in the magnetic-field detecting direction in view of increasing the linearity.

Example 3 and Comparative Example 2

Conditions common to the current sensors of Example 3 and Comparative Example 2 are as follows:
Number of turns of feedback coil above magnetic-field detector, that is, area overlapping with magnetic-field detector: 24
Film configuration of GMR element used as magneto-resistance element. The number in bracket ( ) indicates the thickness (Å) of the layer.
Foundation Layer: NiFeCr (42)/Fixed magnetic layer: $Fe_{60\ at\ \%}Co_{40\ at\ \%}$ (19)/Nonmagnetic material layer: Ru (3.6)/Fixed magnetic layer: $Co_{90\ at\ \%}Fe_{10\ at\ \%}$ (24)/Nonmagnetic material layer: Cu (20)/Free magnetic layer: [$Co_{90\ at\ \%}Fe_{10\ at\ \%}$ (10)/$Ni_{82.5\ at\ \%}Fe_{17.5\ at\ \%}$ (70)]/Antiferromagnetic layer: IrMn (80)/Protecting layer: Ta (100)

Example 3

A magnetic sensor including the shield 124 constituted of the outer shield 124b shown in FIG. 13 was used.
Material of shield: NiFe alloy (19.5 wt % Fe)
Shape of shield: External form 1,000 μm×1,500 μm, Width 220 μm
Thickness of shield: 17 μm
Distance between magnetic-field detector and shield (Z1-Z2 direction): 10 μm Comparative Example 2

A magnetic sensor 53 shown in FIG. 16, which differs from the magnetic sensor 13 of Example 3, was used in a configuration without the shield 124.
Measuring Offset Variation
Offset variations in the output of the magnetic sensors of Example 3 and Comparative Example 2 were measured while varying the external magnetic field so that the absolute value of the plus and minus external magnetic fields ±X mT (X: 5 to 22, per mT) (stress magnetic field, transverse magnetic field) to be alternately applied in the direction perpendicular to the sensitivity axis increase gradually.

Figure 17:
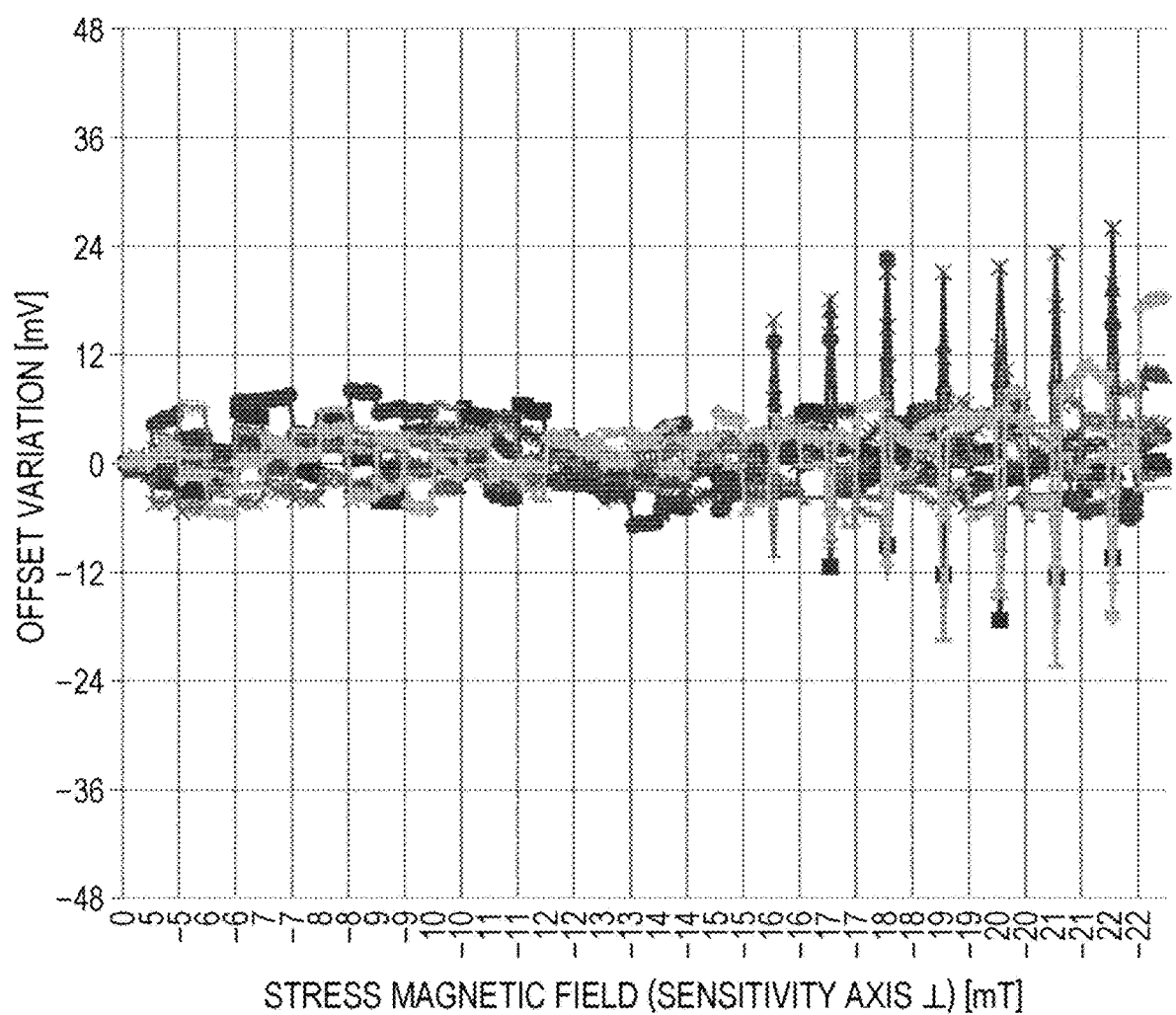
FIG. 17 is a graph showing the resistance to the external magnetic field of the magnetic sensors in Example 3.

FIG. 17 is a graph showing the results of measurement of resistance to the external magnetic field of the magnetic sensors (ten magnetic sensors) in Example 3.

Figure 18:
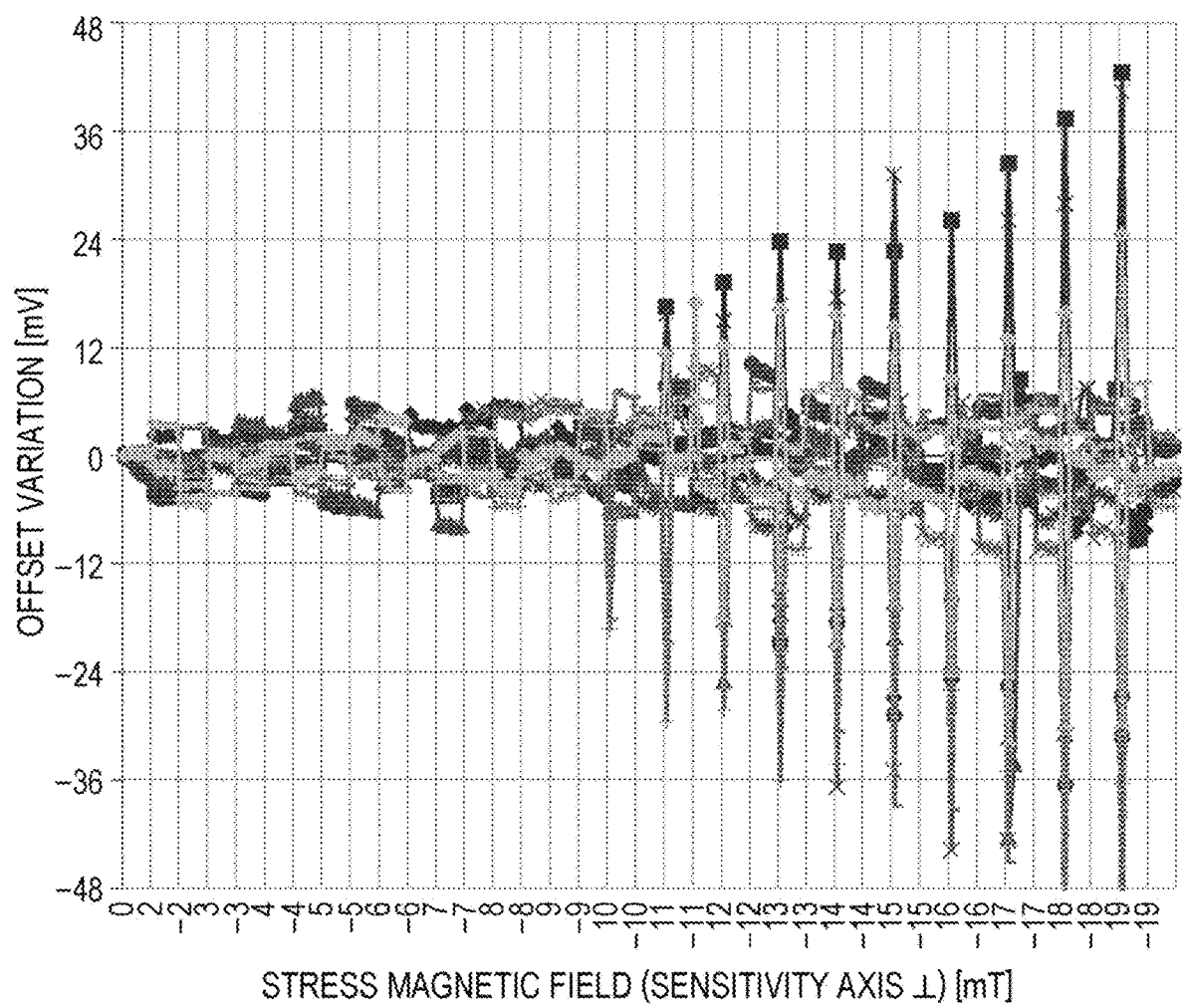
FIG. 18 is a graph showing the resistance to the external magnetic field of the magnetic sensors in Comparative Example 2.

FIG. 18 is a graph showing the results of measurement of resistance to the external magnetic field of the magnetic sensors (ten magnetic sensors) in Comparative Example 2.

As shown in FIG. 17, the magnetic sensors according to Example 3 showed no offset until the external magnetic field reaches ±15 mT, and the offset variation was kept small.

In contrast, as shown in FIG. 18, the magnetic sensors of Comparative Example 2 showed offset when the external magnetic field is ±10 mT, and the offset variation was great.

The results shown in FIGS. 17 and 18 showed that the resistance of magnetic sensors to the transverse magnetic field was increased by providing an annular shield disposed so as to overlap at a position where the direction of the induction field and the direction of the cancellation field B from the feedback coil are opposite. In particular, the combination with the figure-8-shaped magnetic balanced feedback coil including the first coil and the second coil disposed so as to be axisymmetric as viewed from the thickness direction enabled the magnetic sensor to have high resistance to a transverse magnetic field.

The present invention can be used as, for example, a sensor for detecting the magnitude of a current for motor drive.

What is claimed is:

1. A magnetic sensor comprising:
a magnetic-field detector including at least one magneto-resistance element;
a feedback coil, wherein:
the feedback coil includes a first coil portion and a second coil portion; and
a shield;
wherein the feedback coil is disposed so as to overlap with the magnetic-field detector;
wherein the shield is disposed so as to overlap with the feedback coil;
wherein the shield includes:
an inner shield disposed so as to decrease intensity of a magnetic field to be measured to be applied to the magnetic-field detector, wherein, in the inner shield, a direction of the magnetic field to be measured and a direction of a cancellation field of the feedback coil are the same;
an outer shield disposed so as to decrease intensity of the magnetic field to be measured to be applied to the inner shield, wherein the outer shield includes a portion where the direction of the magnetic field to be measured and the direction of the cancellation field of the feedback coil are opposite; and
the first coil portion and the second coil portion are disposed so as to be axisymmetric in shape with respect to a virtual center line perpendicular to a sensitivity direction of the at least one magneto-resistance element as viewed from a direction normal to the inner shield;
wherein the at least one magneto-resistance element comprises four magneto-resistance elements;
wherein the magnetic-field detector is a full-bridge circuit including the four magneto-resistance elements; and
wherein the four magneto-resistance elements are disposed so as to overlap with the virtual center line as viewed from the direction normal to the inner shield.

2. The magnetic sensor according to claim 1, wherein the outer shield surrounds the inner shield.

3. The magnetic sensor according to claim 1, wherein the outer shield is annular in shape.

4. The magnetic sensor according to claim 1, wherein the inner shield is substantially rectangular in shape as viewed from a direction normal to the inner shield.

5. The magnetic sensor according to claim 1, wherein the outer shield has a width less than or equal to a width of the inner shield.

6. A current sensor comprising a magnetic sensor, the magnetic sensor comprising:
a magnetic-field detector including at least one magneto-resistance element;
a feedback coil, wherein:
the feedback coil includes a first coil portion and a second coil portion; and
a shield;
wherein the feedback coil is disposed so as to overlap with the magnetic-field detector;
wherein the shield is disposed so as to overlap with the feedback coil;
wherein the shield includes:
an inner shield disposed so as to decrease intensity of a magnetic field to be measured to be applied to the magnetic-field detector, wherein, in the inner shield, a direction of the magnetic field to be measured and a direction of a cancellation field of the feedback coil are the same;

an outer shield disposed so as to decrease intensity of the magnetic field to be measured to be applied to the inner shield, wherein the outer shield includes a portion where the direction of the magnetic field to be measured and the direction of the cancellation field of the feedback coil are opposite; and the first coil portion and the second coil portion are disposed so as to be axisymmetric in shape with respect to a virtual center line perpendicular to a sensitivity direction of the at least one magneto-resistance element as viewed from a direction normal to the inner shield;

wherein the at least one magneto-resistance element comprises four magneto-resistance elements;

wherein the magnetic-field detector is a full-bridge circuit including the four magneto-resistance elements; and wherein the four magneto-resistance elements are disposed so as to overlap with the virtual center line as viewed from the direction normal to the inner shield.

\* \* \* \* \*